(12) United States Patent
Parsons

(10) Patent No.: US 6,765,278 B2
(45) Date of Patent: Jul. 20, 2004

(54) CIRCUIT STRUCTURE WITH W, WC AND/OR $W_2C$ LAYER ON ALN SUBSTRATE

(75) Inventor: James D. Parsons, Reno, NV (US)

(73) Assignee: Heetronix, Reno, NV (US)

( * ) Notice: Subject to any disclaimer, the term of this patent is extended or adjusted under 35 U.S.C. 154(b) by 0 days.

(21) Appl. No.: 10/175,933

(22) Filed: Jun. 20, 2002

(65) Prior Publication Data

US 2002/0179992 A1 Dec. 5, 2002

Related U.S. Application Data

(62) Division of application No. 09/645,383, filed on Aug. 24, 2000, now Pat. No. 6,576,972.

(51) Int. Cl.[7] .................. H01L 31/058; H01L 23/48
(52) U.S. Cl. ................ 257/470; 257/537; 257/703; 257/783
(58) Field of Search ................ 257/77, 467, 470, 257/703, 782, 783, 537, 433, 417–420, 441, 442, 747, 778, 787

(56) References Cited

U.S. PATENT DOCUMENTS

| | | | | |
|---|---|---|---|---|
| 5,777,543 A | * | 7/1998 | Aida et al. .................. | 338/308 |
| 6,239,432 B1 | * | 5/2001 | Parsons .................... | 250/338.1 |
| 6,291,884 B1 | | 9/2001 | Glenn et al. ................ | 257/747 |

OTHER PUBLICATIONS

*Materials for High Temperature Semiconductor Devices*: Committee on Materials for High–Temperature Semiconductor Devices, National Materials Advisory Board, Commission on Engineering and Technical Systems, National Research Council: National Academy Press, Washington, DC, 1995, pp. 68–70.

O. Nennewitz, L. Spiess and V. Breternitz, "Ohmic Contacts to 6H–SiC", Applied Surface Science, vol. 91, 1995, pp. 347–351.

J.A. Lely and F.A. Kroeger, "Electrical Properties of Hexagonal SiC Doped with N, B or Al", In Semiconductors and Phosphors, Proceedings of Intl. Colloquim–Partenkirchen, Ed. M. Schoen and H. Welker, New York, Interscience Pub., Inc. 1958, pp. 525–533.

M.I. Iglitsyn, et al., "Galvanomagnetic Effects In n–Type Silicon Carbide At Low Temperatures", Soviet Physics—Solid State, vol. 6, No. 9, Mar. 1995, pp. 2129–2135.

(List continued on next page.)

*Primary Examiner*—Minh-Loan Tran
(74) *Attorney, Agent, or Firm*—Koppel, Jacobs, Patrick & Heybl

(57) ABSTRACT

A high temperature hybrid-circuit structure includes a temperature sensitive device which comprises SiC, AlN and/or $Al_xGa_{1-x}N(x>0.69)$ connected via electrodes to an electrically conductive mounting layer that is physically bonded to an AlN die. The die, temperature sensitive device and mounting layer (which can be W, WC or $W_2C$) have temperature coefficients of expansion within 1.06 of each other. The mounting layer can consist entirely of a W, WC or $W_2C$ adhesive layer, or an adhesive layer with an overlay metallization having a thermal coefficient of expansion not greater than about 3.5 times that of the adhesive layer. The device can be encapsulated with a reacted borosilicate mixture, with or without an upper die which helps to hold on lead wires and increases structural integrity. Applications include temperature senensors, pressure sensors, chemical sensors and high temperature and high power electronic circuits.

19 Claims, 15 Drawing Sheets

OTHER PUBLICATIONS

O.A. Golikova et al, Electrical Properties of β–SiC Heavily Doped With Nitrogen, Soviet Physics—Semiconductors, vol. 5, No. 5, Sep. 1971, pp. 366–369.

Q.Y. Tong, U. Gosele, C. Yuan, A.J. Steckl & M. Reiche, "Silicon Carbide Wafer Bonding", J. Electrochem Soc., vol. 142, No. 1, 1995, pp. 232–236.

P.K. Bhattacharya, "Bonding of SiC slabs for electro–mechanical heat–sinks in advanced packaging applications", J. Electronics, vol. 73, No. 1, 1992, pp. 71–83.

Jeffrey B. Casady et al., "A Hybrid 6H–SiC Temperature Sensor Operational from 25° C to 500° C", IEEE Transactions on Components, Packaging and Manufacturing Technology—Part A, vol. 19, No. 3, Sep. 1996, pp. 416–422.

R. Holanda, "Thin–Film Thermocouples on Ceramics", NASA Technical Briefs, Mar. 1997, p. 62.

Y.H. Chaio et al., "Interfacial Bonding in Brazed and Cofired Aluminum Nitride", ISHM '91 Proceedings, 1991, pp. 460–468.

E. Savrum et al., "Thin Film Metallization of Aluminum Nitride Substrates for High–Temperature and Power Microelectronics", published prior to 1999, pp. 281–286.

Westinghouse Astronuclear Laboratory Advertise, "Silicon Carbide Junction Thermistor", circa, 1965.

Takeshi Nagai and Masahiko Itoh, "SiC Thin–Film Thermistors", IEEE Transactions on Industry Applications, vol. 26, No. 6, Nov./Dec. 1990, pp. 1139–1143.

* cited by examiner

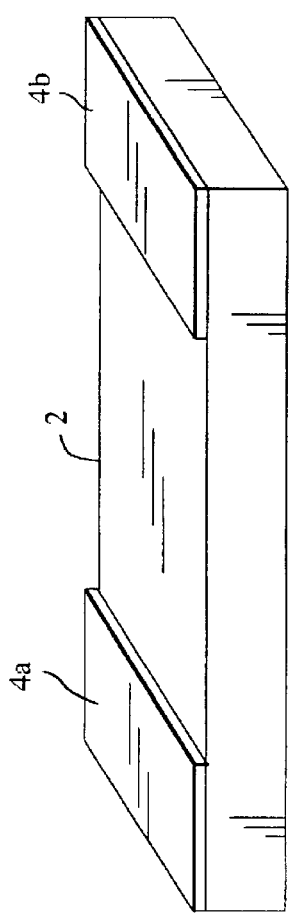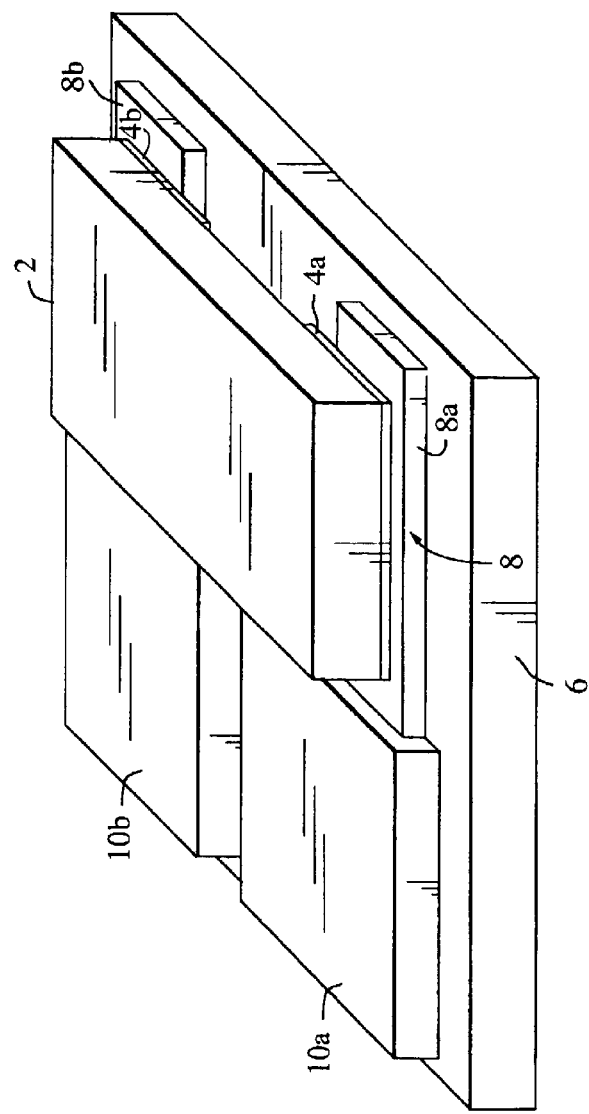
Fig. 1
Fig. 2

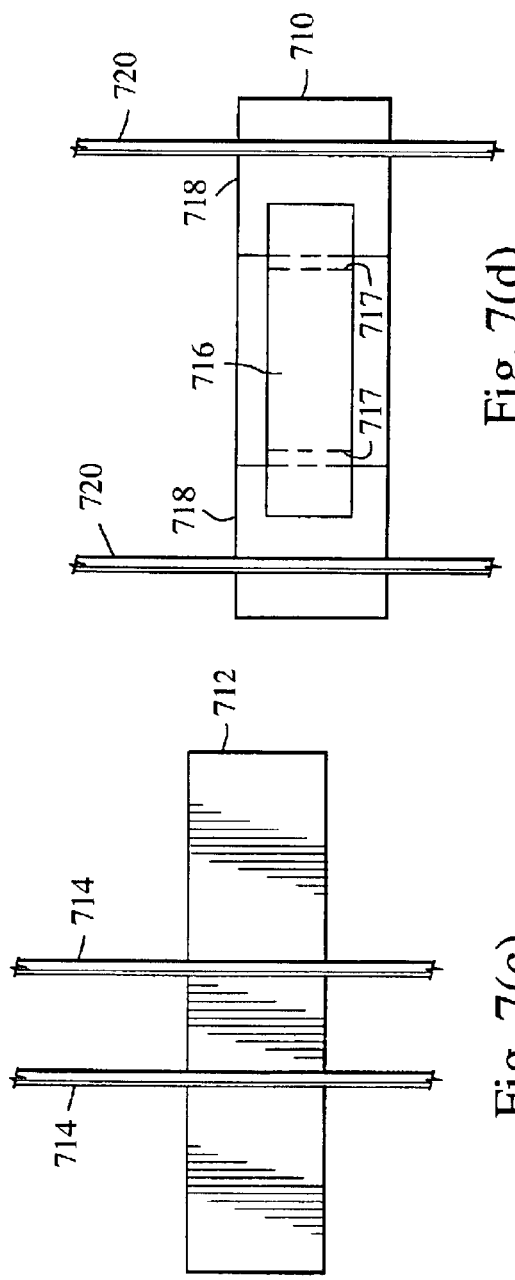
Fig. 7(d)
Fig. 7(c)
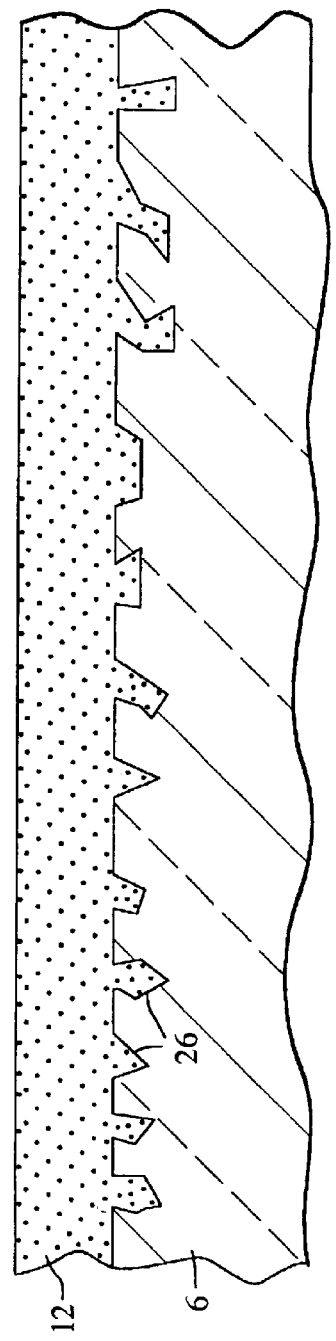
Fig. 8

CIRCUIT STRUCTURE WITH W, WC AND/OR $W_2C$ LAYER ON ALN SUBSTRATE

RELATED APPLICATION

This application is a divisional of application Ser. No. 09/645,383, filed Aug. 24, 2000 now U.S. Pat. No. 6,576,972 for High Temperature Circuit Structures.

BACKGROUND OF THE INVENTION

1. Field of the Invention

This invention relates to temperature sensitive circuits and structures employing SiC, AlN and/or $Al_xGa_{1-x}N(x>0.69)$ as a temperature sensitive device.

2. Description of the Related Art

SiC, AlN and $Al_xGa_{1-x}N(x>0.69)$ are temperature sensitive materials whose resistance changes with temperature and are useful for hostile environment sensor and electronic applications. However, temperature sensors employing these materials have been limited in their usable temperature range because of mechanical deterioration of the sensor structure caused by higher temperature levels, and thermal shock. The general state of the art is summarized in "Materials for High Temperature Semiconductor Devices": Committee on Materials for High Temperature Semiconductor Devices, National Materials Advisory Board, Commission on Engineering and Technical Systems, National Research Council, National Academy Press, Washington, D.C. 1995, pages 68–70, in O. Nennewitz, L. Spiess and V. Breternitz, "Ohmic Contacts to 6H-SiC", Applied Surface Science, Vol. 91, 1995, pages 347–351. Whereas the goal temperature in these references are only 600° C., a significantly higher operating range would be desirable.

Specific structures for SiC temperature sensors are also known. A method for electrical isolation of the back-side of a SiC wafer or device chip is described in Q. Y. Tong, U. Gosele, C. Yuan, A. J. Steckl and M. Reiche, J. Electrochem. Soc., Vol. 142, No. 1, 1995, pages 232–236. A method of bonding SiC slabs for heat sink purposes is described in P. K. Bhattacharya, J. Electronics, Vol. 73, No. 1, 1992, pages 71–83. In J. B. Casady et al., "A Hybrid 6H-SiC Temperature Sensor Operational from 25C to 500C", IEEE Transactions on Components, Packaging and Manufacturing Technology—Part A, Vol. 19, No. 3, September 1996, a SiC JFET structure was integrated with an operational amplifier for temperature sensing up to 500° C.

AlN dies have also been used for high temperature applications. In R. Holanda, "Thin-Film Thermocouples on Ceramics", NASA Technical Briefs, March 1997, page 62, Pt vs PtRh metal thin films were deposited on AlN dies for use as thin-film thermocouples; the drift of the thermocouple junction vs temperature (to 1500° C.) is discussed. In Y. H. Chaio, A. K. Knudsen and I. F. Hu, "Interfacial Bonding in Brazed and Cofired Aluminum Nitride", ISHM '91 Proceedings, 1991, pages 460–468, the reactions for joining interfaces between AlN and several metals is discussed. A multilayer AlN/W structure is shown in which the interface joining is due to interlocking grain-boundaries. In Savrun et al., mentioned above, the thermal stability of $WSi_2$, $NdSi_2$ and $TiSi_2$ films, deposited on AlN dies for the purpose of developing SiC hybrid circuits, was investigated. All silicides were found to change composition upon heating (up to 1000° C.). The films were said to be promising for hybrid circuits with a maximum operating temperature of 600° C.

Various SiC, AlN and $Al_xGa_{1-x}N$ temperature sensors are also described in the following references:

G. Busch, Helvetica Physica Acta, Vol. 19, No. 3, 1946, pages 167–188.

J. A. Lely and F. A. Kroeger, "In Semiconductors and Phosphors", Proceedings of Intl. Colloquium-Partenkirchen, Ed. M. Schoen and H. Welker, N.Y., Inter-science Pub., Inc., 1958, pages 525–533.

M. I. Iglitsyn et al., Soviet Physics—Solid State, Vol. 6, No. 9, March 1995, pages 2129–2135.

O. A. Golikova et al., Soviet Physics—Semiconductors, Vol. 5, No. 5, September 1971, pages 366–369.

Westinghouse Astronuclear Laboratory, "Silicon Carbide Junction Thermistor", 1965.

T. Nagai and M. Etoh, "SiC Thin-Film Thermistors", IEEE Transactions on Industry Applications, Vol. 26, No. 6, November/December 1990, pages 1139–1143.

SiC is generally considered to have a temperature coefficient of resistance (TCR) that varies exponentially with temperature. This thermistor-like TCR, together with circuit stability limitations, have precluded its use for applications that require temperature to be monitored over large ranges, in which a scaling of electronic controls and readouts requires a sensor with an approximately linear TCR, e.g., resistance temperature detectors and thermocouples.

SUMMARY OF THE INVENTION

This invention seeks to provide circuit structures, and systems employing such structures, that maintains their physical integrity at highly elevated temperatures, up to 1300° C. or more. The invention further seeks to provide a SiC temperature sensing mechanism with a substantially linear TCR.

An improved high temperature structure is achieved through the use of an AlN ceramic die to which a circuit device which comprises SiC, AlN and/or $Al_xGa_{1-x}N(x>0.69)$ is adhered by an electrically conductive mounting layer. The mounting layer has a thermal coefficient of expansion (TCE) within 1.0±0.06 that of the die and circuit device, and is preferably formed from W, WC and/or $W_2C$. It can be discontinuous, with a plurality of mutually separated mounting elements that are connected to different portions of the circuit device through respective electrodes. The die's surface is roughened to establish an adhesion to the mounting layer.

In one embodiment the mounting layer includes a W, WC and/or $W_2C$ adhesive layer which is adhered to the die, plus an optional metallization layer that is adhered to the adhesive layer and bonded to electrodes on the circuit device. When used, the metallization layer has a TCE which is not greater than about 3.5 times that of the adhesive layer over a temperature range of interest.

The structure can also include a plurality of electrode pads lateral to the circuit device that have the same composition as the mounting layer, are electrically and mechanically connected to the die, and electrically connected to the mounting layer. When a metallization layer is used and the electrode pads comprise lateral extension of the mounting layer, the metallization layer preferably has a greater thickness at the electrode pads than at the device electrodes.

Lead wires can be connected to the device through the electrode pads and mounting layer, and an encapsulation formed from a reacted borosilicate mixture (RBM) formed over the device, mounting layer, electrode pads and a portion of the lead wires on the die. The encapsulation preferably includes an oxide interface between the RBM and the encapsulated elements. It forms an environmental barrier having a TCE that closely matches that of the device and die, or a viscosity which is less than its Littleton softening point (~$10^7$ poise) An alternate encapsulation technique employs a cover, of the same material as the die, which extends over the device and is bonded to the die by an encapsulation formed from the RBM, or reaction bonded to the die by the RBM.

The new high temperature structure can be used as a contact/immersion temperature sensor for applications that are now performed by integrated circuits, pyrometers, resistance temperature detectors, thermistors and thermocouples, and electromechanical and volume devices such as metal coils and strips, volumetric tubes and bulb thermometers. Other sensor applications include radiation detectors, precision flow rate monitoring and control of gases, tank fluid level monitors, humidity sensors, chemical reaction temperature sensors and electronic circuits that employ a resistance which varies with temperature. The invention can additionally be used in pressure sensors, chemical sensors and high temperature electronic circuits.

The invention also exploits a previously unrecognized property of SiC, which is that it can be doped to have a substantially linear TCR. With n-type doping, a linear TCR is achieved within the temperature range of about 22° C.–1300° C. With p-type doping, the TCR exponentially decreases with increasing temperature until a temperature in the range of about 100° C.–600° C. (depending on the concentration of p-type and n-type dopant atoms), above which an approximately linear positive TCR is achieved up to about 1300° C.

These and other features and advantages of the invention will be apparent to those skilled in the art from the following detailed description of particular embodiments, taken together with the accompanying drawings.

BRIEF DESCRIPTION OF THE DRAWINGS

FIG. 1 is a perspective view of a basic resistor chip in accordance with the invention;

FIG. 2 is a perspective view of the resistor chip in FIG. 1 mounted to a die by means of a high temperature resistant mounting structure in accordance with the invention;

FIG. 8 is an enlarged sectional view illustrating the interface between the adhesive layer and die for each of the embodiments of FIGS. 2–6;

DETAILED DESCRIPTION OF THE INVENTION

Figure 3:
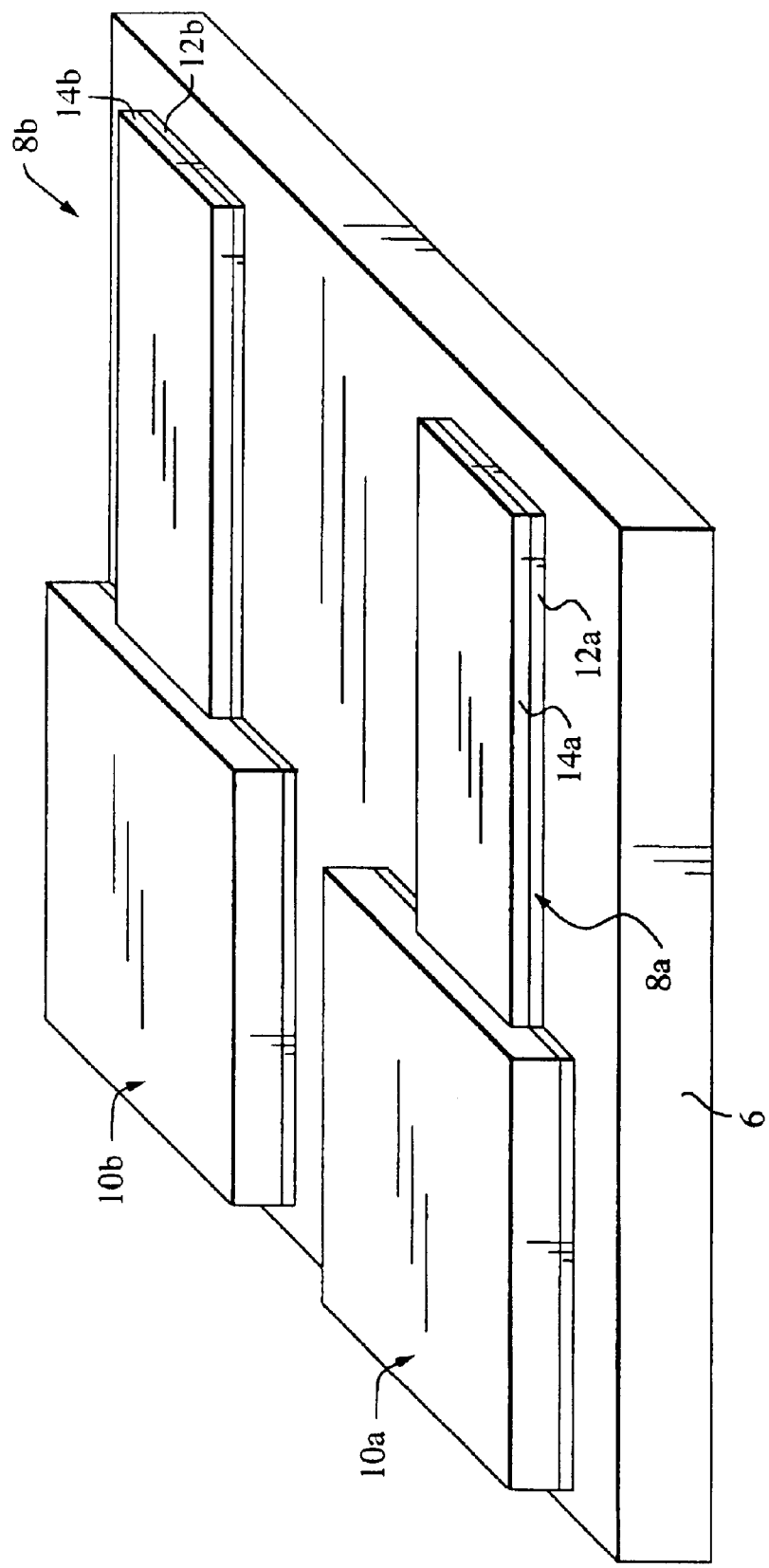
FIG. 3 is a perspective view of a variation of the mounting structure shown in FIG. 2, employing both adhesive and overlay metallization layers.

The present invention provides a new structure for circuit devices, such as temperature sensitive devices, which allows the device to operate at high temperatures, up to 1300° C., without degrading or having its contacts break off, or any hybrid circuit employed in the device come apart. The circuit of the present invention can perform temperature related sensor functions such as temperature, pressure, flow and level measurements, and also electronic circuit functions, over a wide temperature range of from less than –195° C. to greater than 1300° C., and can also withstand difficult environments. Temperature sensing hybrid circuits have been fabricated, calibrated and used to obtain repeatable temperature measurements from less than 22° C. to greater than 1300° C. in an air environment. The mechanical integrity of the hybrid circuits was determined to be unaffected by thermal shock in the range of –195.6° C. to 1300° C. This temperature range and degree of thermal shock resistance substantially exceeds those achieved with prior hybrid circuits.

The hybrid circuits may contain one or more semiconductor chips, with each chip functioning as a resistor or an integrated circuit (IC). The particular materials and their compositions are selected to impart distinctive thermal range and corrosion resistance capabilities to the hybrid circuit. A hybrid-circuit is like an IC; both are comprised of more than one device, and connected to each other and/or the outside world by an electrical circuit path. The difference is that a die functions as the mounting base for individual device "chips" (or sometimes an IC chip and other individual device chips) and their electrical interconnecting circuitry in hybrid-circuits, while all IC devices and circuit interconnects are monolithically constructed in and on a single semiconductor wafer.

FIG. 1 illustrates the basic resistor/IC chip 2 with electrodes 4$a$, 4$b$ at either end. The chips must be formed from SiC, AlN and/or Al$_x$Ga$_{1-x}$N(x>0.69). The chip may contain thin films of other semiconductor materials and compositions, so long as at least 90% of the chip thickness is comprised of SiC, AlN and/or Al$_x$Ga$_{1-x}$N(x>0.69) to insure that the required TCE matching between the die and the chip is maintained. These materials are highly resistant to thermal shock. A resistor was selected as a device for reduction to practice because it has the maximum temperature range of any semiconductor type for a given semiconductor material. Because of their large bandgap and close TCE match with ceramic AlN, SiC, AlN and Al$_x$Ga$_{1-x}$N (x>0.69) are the only known semiconductors that can utilize the maximum temperature ranges, up to at least 1300° C. SiC, AlN and Al$_x$Ga$_{1-x}$N(x>0.69) have respective TCEs in the basil plane at 300° K. of 4.2×10$^{-6}$°K., 4.2×10$^{-6}$/° K. and 4.5×10$^{-6}$/° K., respectively; thermal conductivities at 300° K. of 4.9, 2.0, and 1.5 W/cm° K.; maximum temperature ranges for semiconductor device types other than resistors of <0° C. to ≦1160° C., <0° C. to 1010° C., and <0° C. to ≦930° C.; and melting temperatures of 2500° C., 2800° C. and >1500° C.

FIG. 2 illustrates a complete circuit structure except for lead wires, with the chip 2 flipped over from the orientation shown in FIG. 1. The device is formed on an AlN ceramic die 6 which functions as a platform for a thermally and environmentally stable hybrid electrical circuit. The circuit may be used to interconnect semiconductor device/IC chips with each other, and with the outside world, with the chips performing sensor and/or electronic functions. Alternately, the circuit formed on the die may be used without chips as a temperature/pressure/strain vs electrical resistance sensor. The die's TCE closely matches that of the chip(s) (to within 1.0±0.06), is highly resistant to thermal shock, and is electrically insulating.

AlN satisfies these physical and electrical properties for the die, and has additional advantages. Relevant physical and electrical properties polycrystalline of ceramic AlN for the purposes of the invention are: TCE of $4.4 \times 10^{-6}/°$ K. at 300° K. and $5.3 \times 10^{-6}/°$ K. at 1273° K.; thermal conductivity of 1.5 W/cm° K.; electrical resistivity $>10^{14}$ ohm-cm 300° C.; resistance to chemical reaction with metals equal or superior to other commercial ceramics; sublimates at 2500° C. for chemical bonding stability; maximum temperature for continuous use between 1150° C. and 1800° C., depending upon environment; Knoop hardness of about 250 Kg/mm$^2$; shear strength of about 450 MPa; flexural strength of about 315 MPa; density of about 3.30 g/cc; porosity of 0%.

Single crystal AlN could also be used for the die. However, at present it is considerably more expensive than polycrystalline ceramic AlN, and its smooth surface would most likely need roughening to adhere the mounting layer discussed below. For purposes of the invention, the term "die" is not limited to a polycrystalline ceramic.

A mounting layer 8, shown as a pair of separate mounting elements 8a and 8b, align respectively with the two chip electrodes 4a and 4b to mechanically secure the chip and its electrodes to the die, and to provide an electrical connection to the electrodes.

Electrode pads 10a and 10b, which are preferably formed from the same material as the mounting elements 8a and 8b, are provided on the die lateral to the chip device and in contact with the respective mounting elements. The electrode pads are comprised of one or more thin or thick films which provide electrical current paths to the mounting elements.

In the device of FIG. 3, which does not show the chip 2 or electrodes 4a and 4b so that the underlying elements can be better seen, the mounting elements 8a and 8b are implemented with underlying adhesive layers 12a and 12b surmounted by overlay metallization layers 14a and 14b; the overlay metallization layers can be used to increase the cross-sectional area of the current path, to protect the mounting layer from corrosion, and/or to prow vide for bonding of the chip electrodes. The electrode pads 10a and 10b are implemented as extensions of the mounting elements 8a and 8b, each having an adhesive layer which is a continuation of its corresponding mounting element adhesive layer 12a or 12b, and an overlay metallization layer which is an expanded continuation of its corresponding mounting element overlay metallization layer 14a or 14b.

The adhesive layers 12a and 12b are thin or thick films of material which secure the overlay metallization to the AlN die surface. To accomplish this, their TCE must closely match that of the AlN die and the chip (to within 1.00±0.06), they must not chemically react with the die, and there must be little or no chemical reaction between them and the overlay metallization, all up to the maximum operating temperature. Further desired characteristics are for little or no solid-solubility or interdiffusivity between the adhesive layer and the die, and a melting temperature greater than the maximum operating temperature. The lack of reaction, solid-solubility and interdiffusivity between the adhesive layer and die ensures that the adhesive layer is not consumed by reaction with the die at high temperatures, and that the die surface does not become electrically conductive. The matching TCEs ensures that the adhesive layer does not peel away from the substrate surface during thermal cycling.

With respect to the overlay metallization layer, the adhesive layer should exhibit little or no chemical reaction, bond by interdiffusion and/or solid-solubility, remain distinct at and near their interface, and the maximum solid-solubility between them must be limited so that they do not form an isomorphic or pseudo-isomorphic phase diagram, all up to the maximum operating temperature. These requirements ensure that the adhesive layer is not completely consumed by reaction with the overlay metallization layer, which would allow the electrode pads 10a and 10b to delaminate from the die during thermal cycling.

Tungsten (W), WC, and W$_2$C have physical and electrical properties which uniquely satisfy all of these requirements for the adhesive layer. The overlay metallization may not be needed when the adhesive layer and chip electrodes can form a good bond without it. This would be the case with a W adhesive layer, or W with an interior C layer that transforms to WC between two outer W layers during processing. Since W oxidizes, when the device is exposed to an oxidizing gaseous environment, for example through use as a chemical sensor, the overlay metallization protects it from the environment. For this purpose the overlay metallization should be a non-oxidizing material platinum, gold, palladium and silver are suitable. The overlay metallization is preferably thicker at the electrode pads than at the mounting layer to facilitate the bonding or welding of lead wires to them.

The overlay metallization must be bondable to the chip electrodes and to the adhesive layer. Interdiffusion or solid-solubility between the overlay metallization and the underlying adhesive layer must not result in complete consumption of the overlay metallization, or else the chip electrode bonds may weaken and the chip electrode delaminate from the mounting layer during thermal cycling. For vacuum, inert or reducing environments in which oxidation is not a concern, many other materials could be used for the overlay metallization, such as W, WC, W$_2$C, Ag, Cr, Hf, HfC, Ir, Mo, Ni, Nb, Os, Pd, Pt, Re, Rh, Ru, Ta, TaC, Ti, TiC, V, Y, Zr and ZrC. Materials such as Co which form an alloy or intermetallic with W at the temperature range of interest should not be used.

It is not necessary to have a close TCE match between the overlay metallization and the die or adhesive layer. This is believed to be because the overlay metallization is malleable enough to absorb the strain caused by differences in expansion and contraction rates. Structural integrity at high temperatures will be maintained as long as the overlay metallization TCE is within 3.5 times that of the die or adhesive layer.

Multiple overlay metallization layers may be applied to the electrode pads 10a and 10b to increase their current capacity, to provide corrosion resistance, and to provide for bonding or welding of lead wires. The thickness of the metallization layers that can participate in the lead wire bonding and welding process must be at least 0.05 times the diameters of the lead wires.

Figure 4:
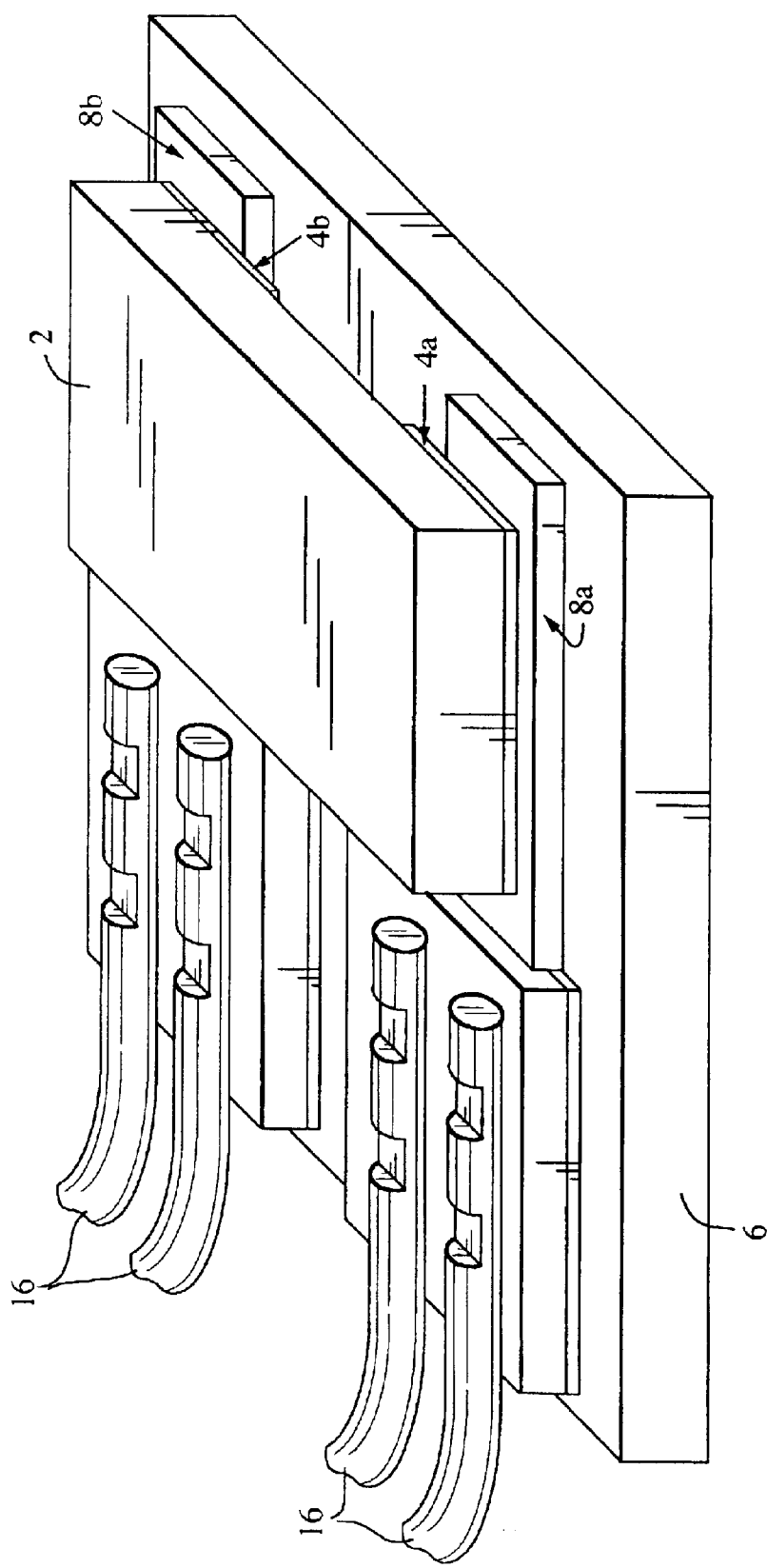
FIG. 4 is a perspective view of the structure shown in FIG. 2 with lead wires added.

FIG. 4 is a view similar to FIG. 2, but with lead wires 16 added to the electrode pads to provide electrical connections between the high temperature device and external electronics. The lead wires are bonded or welded to the electrode pads and should have a closely matched TCE (except for the embodiment of FIG. 6, discussed below, in which compressional forces maintain the contact between the lead wires and electrode pads). To prevent the lead wire-electrode pad bonds or welds from separating during thermal cycling, interdiffusion, solid-solubility and chemical reactions between the lead wires and the layer of the electrode pads to which they are bonded or welded must not consume the undetiying adhesive layer. Suitable materials for the lead wires in a vacuum, inert or reducing environment for operation up to 1400° C. are Ni, Pd, Pt and their alloys and intermetallics, and Ni—Cr alloys; for operation up to 1300° C., Au—Pt, Au—Pd, Pd—Pt and Ag—Pd alloys can also be used. However, these materials are not appropriate in a temperature range in which they form an alloy or intermetallic compound with W.

Figure 5:
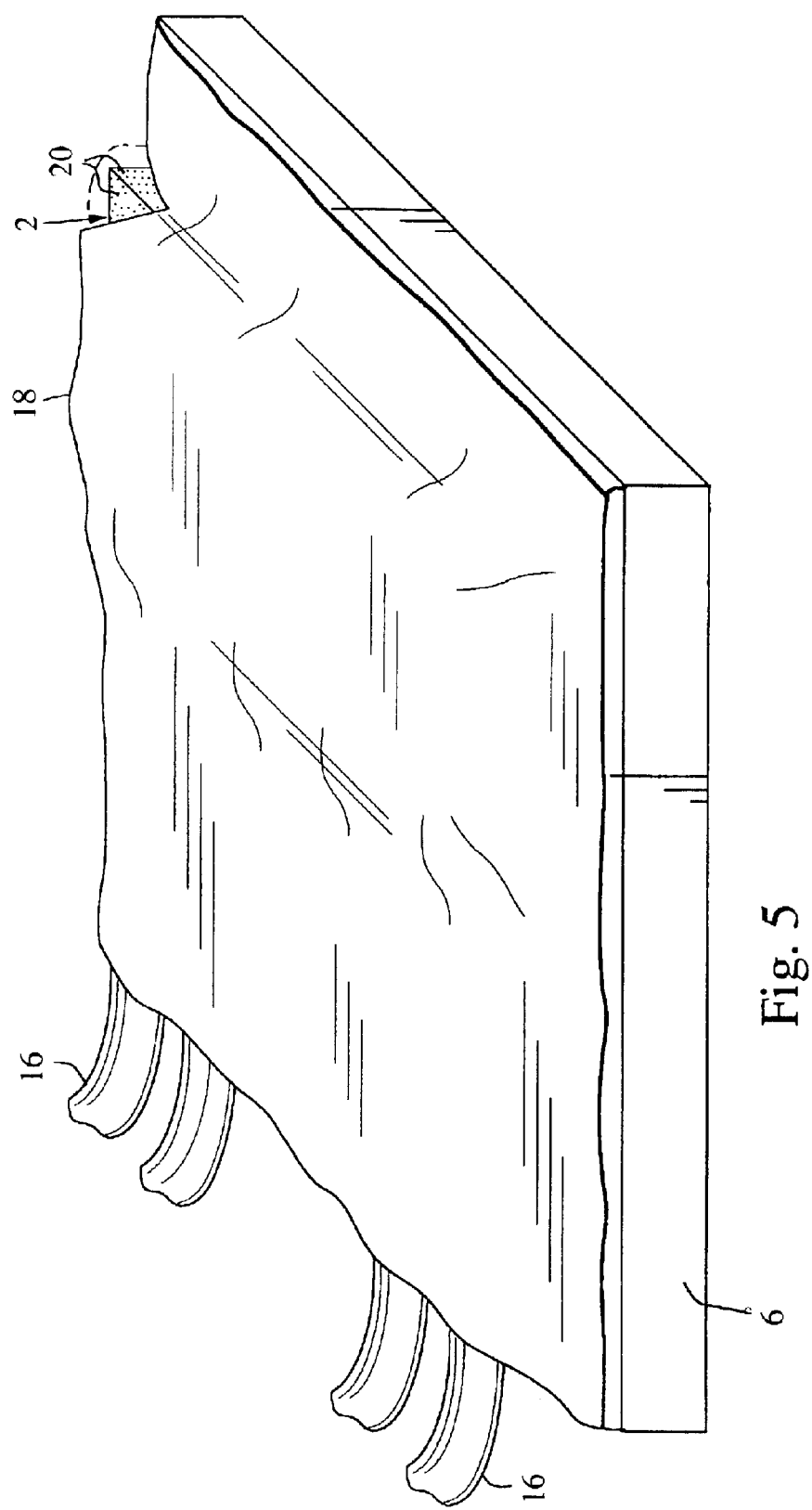
FIG. 5 is a perspective view of an encapsulated version of the structure shown in FIG. 4.

FIG. 5 shows a variation of the FIG. 4 device in which the device is coated with an encapsulating material 18. The encapsulation can serve one or more of the following functions: (1) assist in adhesion of the chips to the mounting layer; (2) assist in adhesion of the mounting layer and/or the electrode pads to the die; (3) assist in adhesion of lead wires, especially lead wires that extend through vias in the dies when multiple dies are stacked together; and (4) encapsulate the device for environmental and physical protection.

The preferred encapsulation material is a reacted borosilicate mixture (RBM). Thermally reacting a borosilicate mixture while it is in contact with the device elements causes the contacted surfaces of the device to oxidize, forming an oxide layer that bonds the RBM to the device. The oxide layer is indicated by reference numeral in the broken away portion of FIG. 5.

The requirements for the RBM composition and preparation are much more relaxed when the encapsulation is used only for adhesion purposes than when it is also used as an environmental barrier. Requirements for a material to be used for adhesion and environment barrier purposes are:

Should be an electrical insulator up to 1300° C.

Should not contaminate any part of the underlying device with conductive metals.

Should be a glass former, for environmental barrier formation and survival during rapid thermal cycling.

Should be very reactive with adjoining services to form a reacted mixture.

To facilitate processing, the unreacted mixture should undergo reactions at low temperatures.

The unreacted mixture should be chemically and mechanically stable at temperatures exceeding 1300° C.

Should have a TCE which closely matches that of the die and chip, or a viscosity less than its Littleton softening point. With reduced viscosity at increasing temperatures, this allows the RBM to seal itself during thermal cycling.

Mixtures of $B_2O_3$ and $SiO_2$ have been shown to be promising for these purposes. They can be mixed together and applied to surfaces as dry powders. For environmental barrier and adhesive/entrapment applications, limiting the maximum molecular concentration of $SiO_2$ in the RBM mixture to 0.46 will give the mixture a TCE at least as great as that of the AlN die (mole % not greater than 46, weight % less than 43).

For adhesive/entrapment applications without an environmental barrier, the RBM composition preferably contains more $B_2O_3$ (the constituent that melts to incite the reaction) than $SiO_2$ ($SiO_2$ mole % less than 50, weight % less than 47). The maximum $B_2O_3$ mole fraction is limited by the requirement that the RBM viscosity and surface tension be sufficient for the encapsulation to hold itself in place.

The preferred preparation procedure is to first mix the $B_2O_3$ and $SiO_2$ together and grind the mixture into a fine powder. For adhesive/entrapment applications only, the ingredients may be ground separately and then mixed. The average post-grinding particle size should be less than 500 microns, the smaller the better. It can be applied to the device surfaces as a dry powder or dispersed in an organic solvent, but it should be dry before reacting to prevent splitting.

The coated devices is then heated to at least the melting temperature of $B_2O_3$ (460° C.), preferably in an oxidizing or alternately in an inert atmosphere. Heating can be accomplished by conventional and rapid thermal techniques. The reaction proceeds most favorably when the coated device is passed through the melting temperature of $B_2O_3$ as rapidly as possible, since the total reaction time is approximately one second. The best heating method is anticipated to be rapid thermal annealing, using IR heating. During the reaction the $B_2O_3$ melts and reacts with the $SiO_2$ to form a glaze or a glass. As the $B_2O_3$ melt and $SiO_2$ react, they bond with oxidizing the surfaces with which they are in contact by oxidizing the surfaces with which they are in contact.

Figure 6:
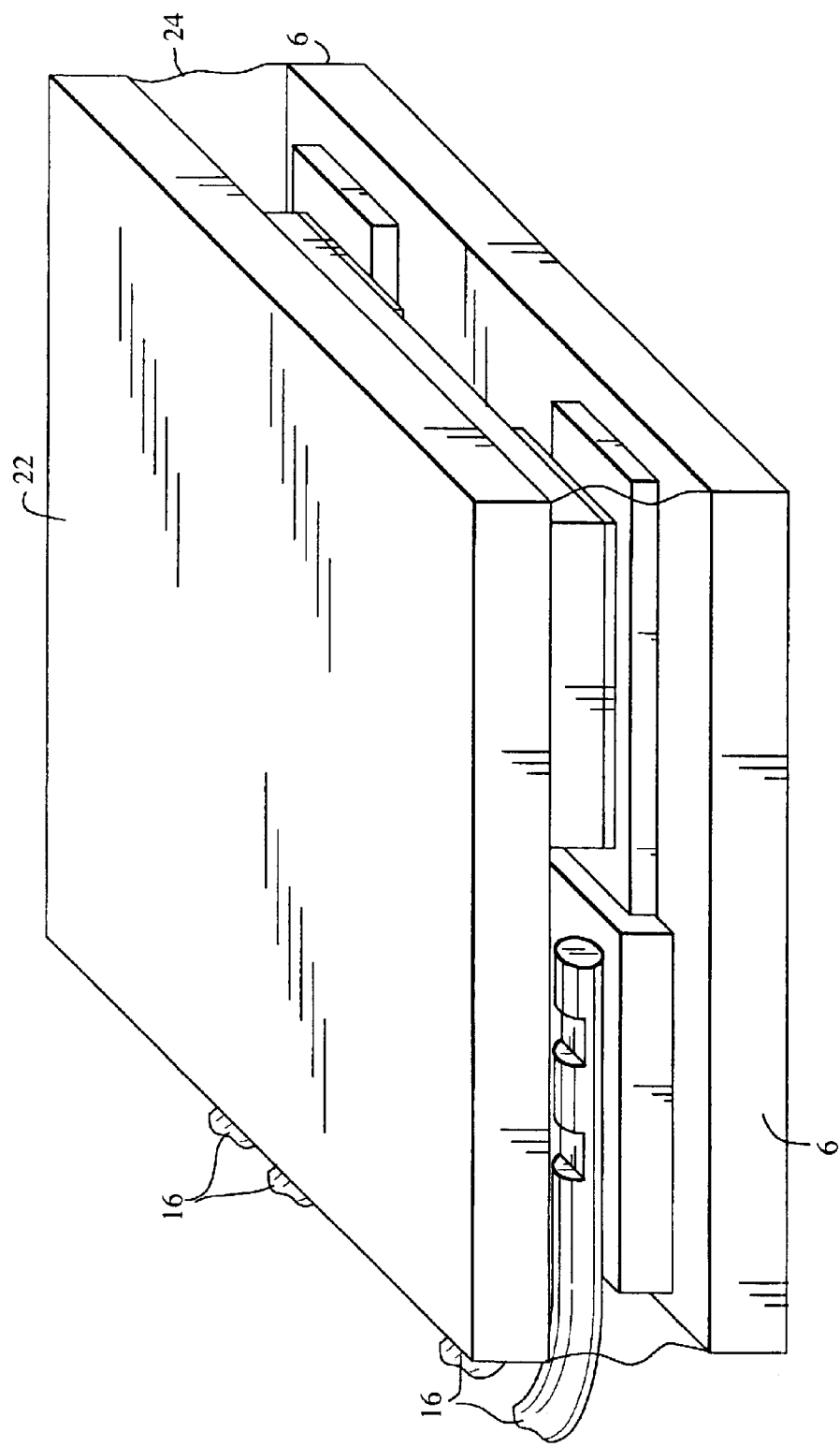
FIG. 6 is a perspective view of a different encapsulation scheme for the structure of FIG. 4, including an upper die.

Another variation, shown in FIG. 6, covers the exposed surfaces of the device with a second AlN die 22. The second die 22 is held in position by an RBM encapsulation 24 which bonds to the facing surfaces of the two dies 6 and 22 (the RBM is shown as transparent in FIG. 6 so that the encapsulated elements can be seen). The second die 22 protects all of the underlying device elements, and also holds the lead wires against the electrode pads with a compressional force exerted by the RBM.

A multilevel hybrid-circuit can be formed from any combination of the embodiments shown in FIGS. 4, 5 and 6 by stacking multiple devices vertically, with a separate die acting as the circuit platform for each level. The circuits of different levels can be interconnected through vias in the dies. This type of structure is illustrated in FIGS. 7(a)–7(d).

Figure 7A:
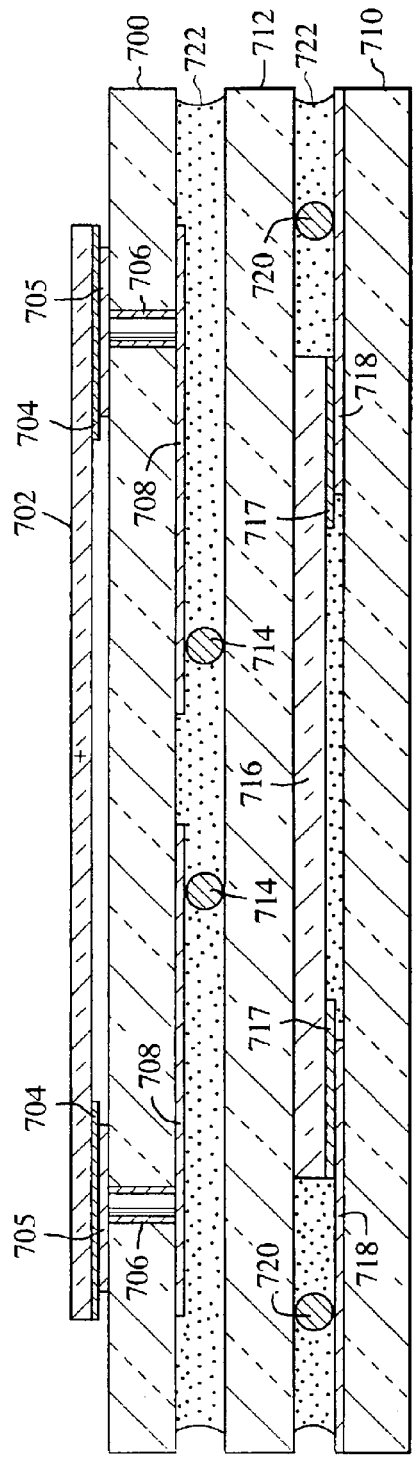
FIG. 7($a$) is a sectional view of a "stacked" sensor structure while FIGS. 7($b$), 7($c$) and 7($d$) are plan view of three ceramic dies (including devices, circuits and lead wires) that are connected together to form the structure of FIG. 7($a$)
Figure 7B:
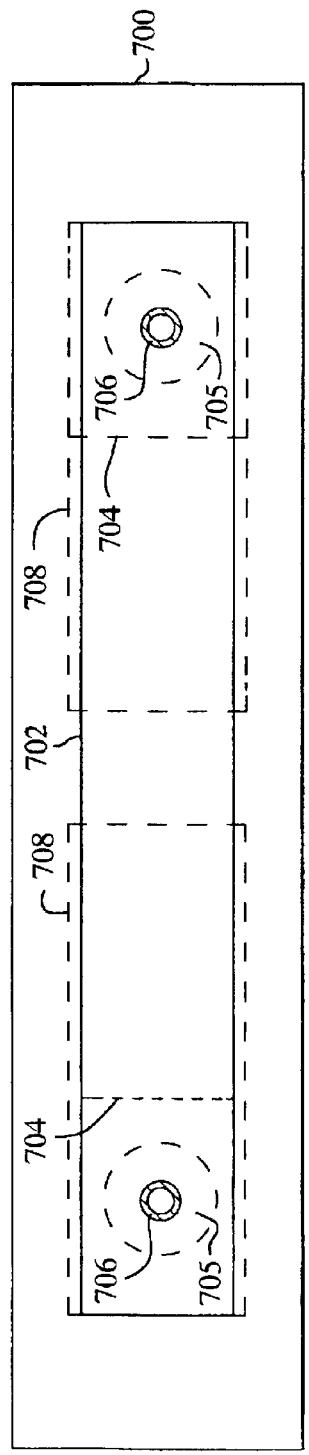
Figure 9:
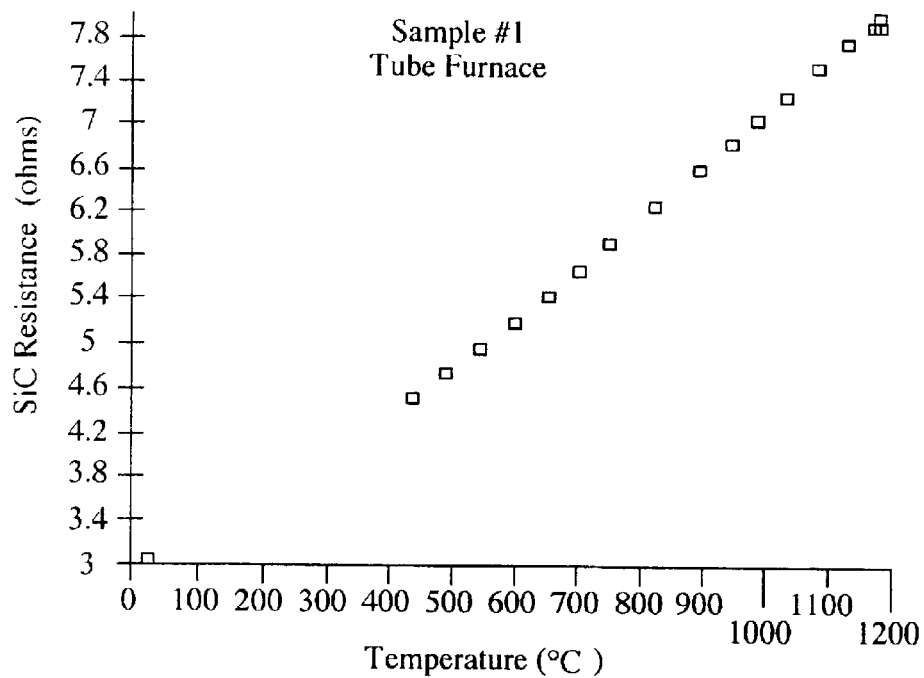
FIGS. 9–17 are graphs demonstrating the newly discovered linear TCR characteristic of doped SiC.
Figure 10:
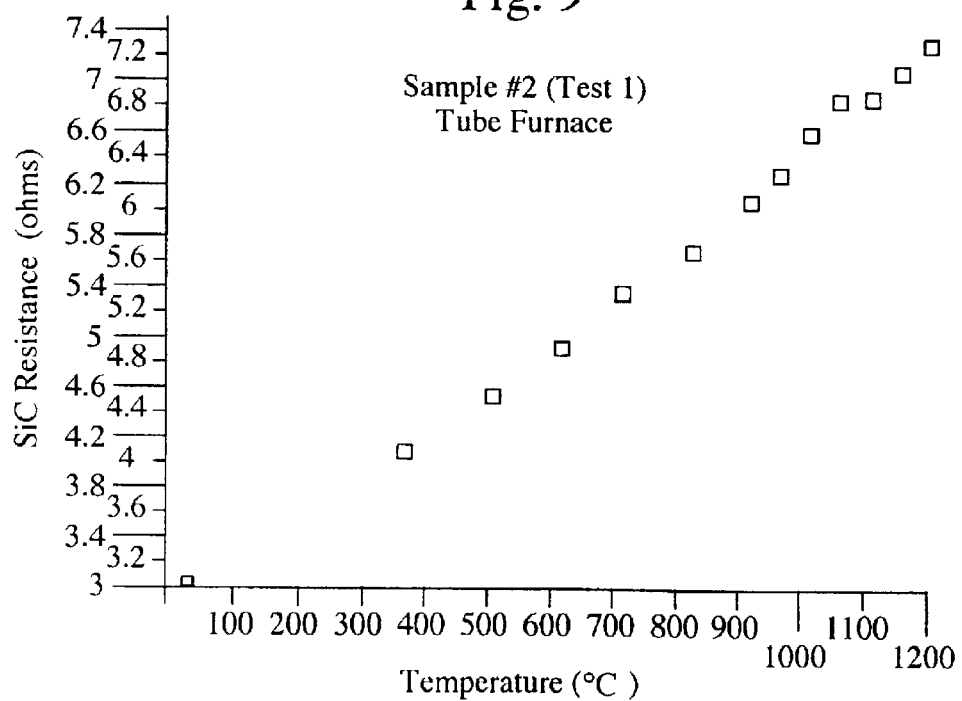
Figure 11:
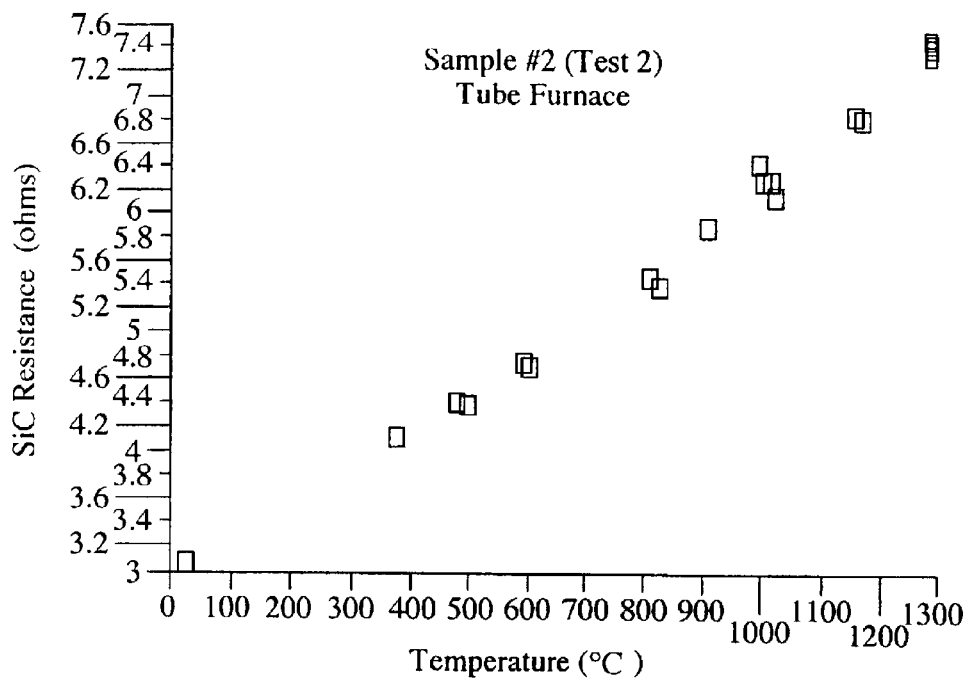
Figure 12:
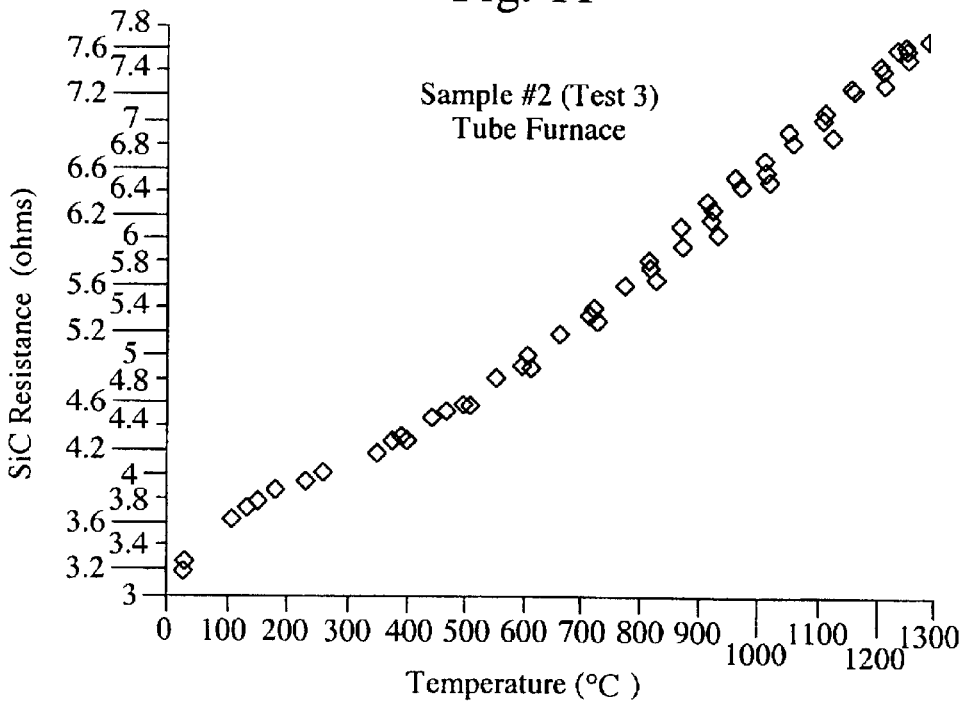
Figure 13:
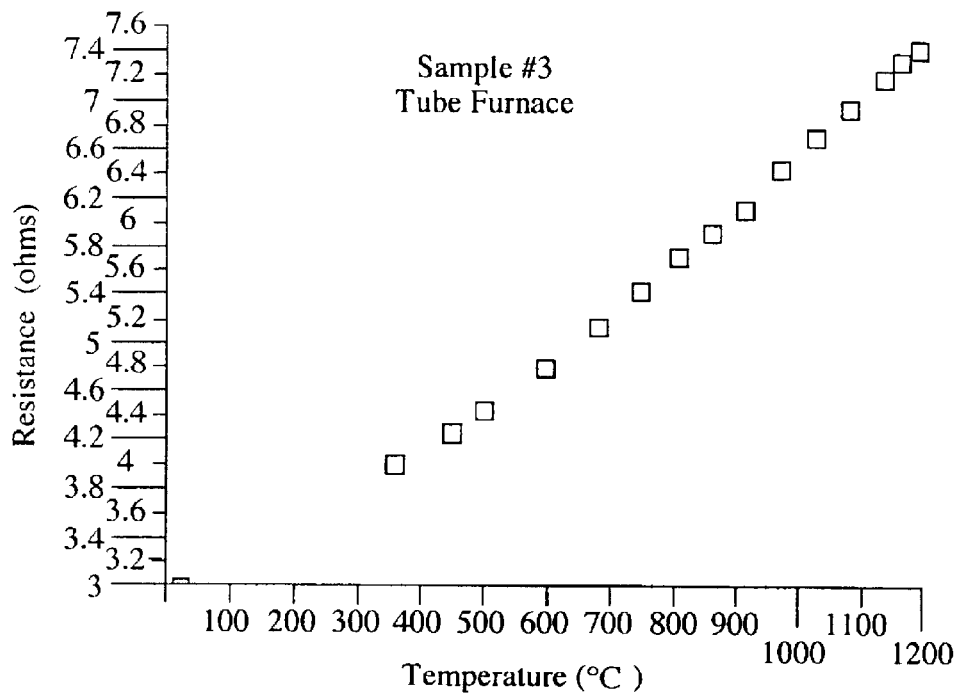
Figure 14:
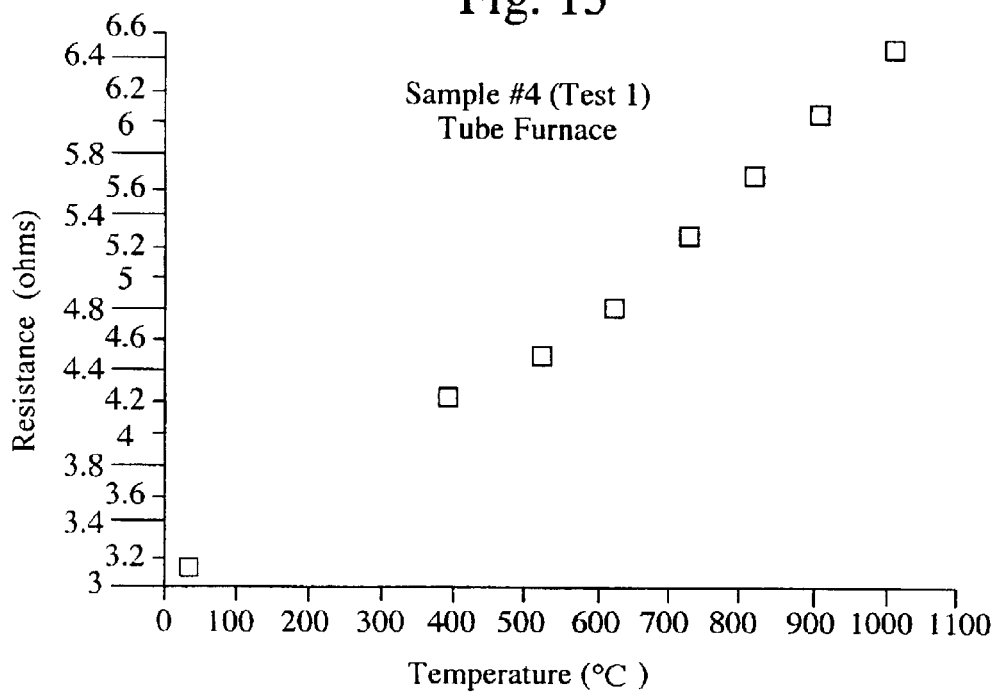
Figure 15:
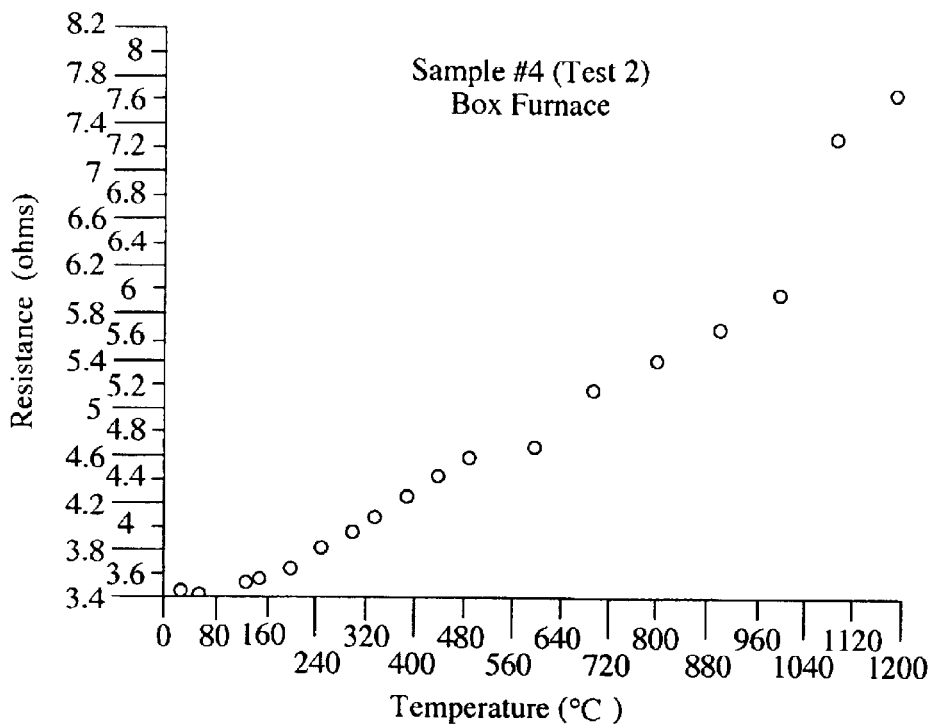

FIG. 7(a) shows the overall device, a temperature compensated chemical sensor. An upper die 700 also shown in FIG. 7(b), carries a sensor strip 702 formed from a chemically sensitive material. The die structure establishes a current limiter, with an electrical conductivity that is controlled by surface reactions with the environment. Spaced chemical sensor contact pads 704 on the underside of the sensor strip mate with via metallization pads 705 on the upper surface of the die 700, and are connected by metallized vias 706 to respective lead wire contact pads 708 on the underside of the die.

The upper die 700 is electrically isolated from a lower temperature compensation die 710 by an intermediate isolation die 712, also shown in FIG. 7(c). Isolation die 712 carries a pair of lead wires 714 which contact pads 708 on the sensor die 700. This allows a signal indicating the conductivity of the sensor strip, and hence the nature of the environment, to be brought out.

The temperature compensation die 710, also shown in FIG. 7(d), includes a temperature sensing resistor 716 with electrode pads 717 mounted to spaced contact pads 718 on the die's upper surface. A pair of lead wires 720 cross the contact pads 718 and enable the resistance value of the resistor 716, and thus the temperature, to be sensed. This information can be used to compensate for temperature-induced errors in the chemical sensor output. An RBM encapsulation 722 seals and bonds the upper, lower and middle dies.

As illustrated in FIG. 8, the adhesive layer 12 holds itself to the die 6 by penetrating into crevices 26 in the die surface. The number of required crevices per unit area increases with decreasing crevasse depth. Although difficult to quantify, good adhesion appears to be obtained on an AlN die that has a matte appearance. Useful adhesion is not obtained on highly polished, specular AlN die surfaces.

The die surface can be roughened by chemical or thermal etching techniques. Heating a specular surface to 1000° C. in air for one minute will sufficiently roughen it to obtain good adhesion. Roughening is relatively easily obtainable because ceramic AlN is polycrystalline and contains trace concentrations of binders (such as yt-tria); these factors provide for non-uniform surface etching rates.

The adhesive layer can be applied in the correct stociometry to the AlN die surface by several vapor phase deposition techniques, such as RF/DC sputtering, RF/DC co-sputtering, e-beam evaporation and chemical vapor deposition (CVD). The temperature of the die during deposition of the adhesive layer is not important, since adhesion occurs by physical rather than chemical bonding.

As deposited, the adhesive film will be less than theoretical density, unless deposited by CVD. The film density can be increased and the grain-boundary area reduced by thermal annealing. When the density or grain-boundary area are important for protecting the adhesive layer/die surface from an overlay metallization, the adhesive layer should be annealed before application of the metallization layers. The annealing temperature range is generally 800° C.–1400° C.; the density and grain-growth depend upon time-at-temperature. The annealing atmosphere should be either a vacuum or inert (such as Ar or $N_2$).

Tungsten (W) adhesive films can be partially or completely converted to WC and/or $W_2C$ by "forming". In this process carbon is applied to preferably as deposited, or annealed, W adhesive films by CVD, or by the physical application of graphite such as by screen printing. The W film is transformed to a carbide by thermally induced diffusion ("forming") at a temperature within a range of about 800° C.–1400° C., with a higher temperature preferred.

The minimum preferred adhesive layer thickness as deposited is 0.1 micron, if the adhesive layer is to be covered by one or more overlay metallization layers. If no overlay metallization layers are used, its minimum thickness must satisfy the following requirements: (1) the post-processing thickness of the adhesive layer must exceed the die surface roughness by at least the thickness of the chip electrodes; (2) its cross-sectional area must be sufficient to handle the current required by the device; and (3) it must be thick enough to allow for a partial consumption of the adhesive layer by reaction with an RBM, if used. Experimental investigations indicate that less than 500 angstroms of W and its carbides is consumed by this reaction.

The overlay metallization on the adhesive layer can consist of one or more layers, each applied or deposited sequentially. Depending upon the particular metallization material selected, the metallization layers can be applied by painting, screen printing, electroplating or vapor deposition techniques.

The processed overlay metallization can be comprised of individual or graded compositions of one or more elements, compounds or alloys. The processed overlay metal-appiled by paintings screen printing, electroplating or vapor deposition techniques.

The processed overlay metallization can be comprised of individual or graded compositions of one or more elements, compounds or alloys. The processed overlay metallization can be left as applied or deposited, or it can be thermally processed to redistribute the film composition or to cause constituents to chemically react. Melting can occur in one or more (but not all) layers of the overlay metallization during thermal processing, but the resulting compounds and/or alloys must be solids at the same processing temperature. For example, Au—Pt alloys can be formed by heating a Au/Pt multilayer structure to a temperature in excess of the Au melting temperature, but below the melting temperature of the desired alloy, in which case only the Au melts and is quickly consumed by the Pt to form an alloy.

When both an overlay metallization on the adhesive layer and an RBM encapsulation are employed, about 100–1000 angstroms of oxidizable metallization layer material will be sacrificed to form an oxide layer by reaction with the RBM of metals which were investigated for their reaction properties with RBM, the only ones which were not observed to oxidize were Au and Pt.

For an overlay metallization on the contact pads, the minimum thickness of the metallization is 0.05 times the lead wire diameter. However, a minimum thickness of at least 0.1 times the lead wire diameter is recommended to increase yield and improve the ruggedness of the bond between she lead wire and electrode pad. sacrifice of overlay metallization to form an oxide layer with an RBM applies as for overlay metallizations on the adhesive layer.

The chip electrodes can be bonded to the mounting layer by thermo-compression bonding, diffusion bonding or brazing. In thermo-compression bonding, the chip electrodes are pressed against the mounting layer and heated, with the combined pressure and temperature inducing bonding by interdiffusion. In diffusion bonding, the material on one of the surfaces diffuses into and changes the composition of the material on the surface which it contacts. The process is thermally activated and may be assisted by compressing the mounting layer and chip electrodes together during heating. For example, a mounting layer and chip electrode with facing surface layers of W can be diffusion bonded to each other by applying a thin layer of carbon to either or both surface layers, securing the surfaces with the interposed carbon firmly against each other, and heating the structure to above about 700° C. The carbon will be consumed to form $W_2C$ and WC, at the expense of the W. The resulting $W_2C$ and WC bond the chip electrodes to the mounting layer by becoming part of each.

Brazing involves the melting of at least one of the constituents which participates in the bonding process. For example, with a mounting layer and chip electrodes having facing surface layers of Pt, brazing can be performed by applying a thin layer of Au to either or both surface layers, securing the two with the interposed Au firmly against each other, and heating the structure to above about 1065° C. The Au melts, as it is consumed by the facing Pt layers, to form an Au—Pt alloy. This alloy bonds the chip electrodes to the mounting layer by becoming part of each, with the Au—Pt alloy melting temperature being greater than that of Au but less than that of Pt.

The lead wires can be attached by bonding or welding to the overlay metallization layers of the electrode pads. The TCE of the lead wire material should be within about 1.1 times that of the composite TCE of the overlay metallization layers. The portion of the lead wires to be bonded or welded to the electrode pads may be flattened, in which case the lead wire thickness perpendicular to its flattened surface is the appropriate diameter to use in determining the minimum thickness of the electrode pads' overlay metallization layers.

Lead wires can also be connected by inserting them through holes in the electrode pads or mounting layer areas of the hybrid-circuit, and crushing both ends of the lead wires which extend from the holes against the die. AlN ceramic is very strong, and will accommodate this type of procedure.

Ten devices of the type shown in FIG. 6 were fabricated as follows:

SiC Resistor Fabrication

1. Polish, clean and electrically qualify SiC wafers to determine precise resistor dimensions.
2. Oxidize SiC wafers.
3. Remove oxide from top surface of SiC wafer and perform electrical qualification testing.
4. Deposit 2000 Angstrom TiC+C layer on exposed SiC surface by chemical vapor deposition (CVD).
5. Deposit 1000 Angstrom W layer on TiC+C, by sputtering.
6. Carburize W layer by annealing W/C/TiC/SiC to form WC and/or $W_2C/TiC/SiC$, at 1200° C. for 2 hours.
7. Deposit 1000 angstrom W layer on (WC and/or $W_2C$), by sputtering.
8. Form W layer by annealing in Ar at 1000° C. for 1 hour.
9. Photomask to expose resistor electrode areas (elements 4a and 4b in FIG. 1).
10. Deposit 1000 Angstroms of Pt on resistor electrode areas, by sputtering.
11. Aqua regia etch and lift-off to define fresistor electrode area array on SiC wafer.
12. Dice SiC wafers into resistor chips (element 2 in FIG. 1).

Thin Film Circuit and Electrode Pad Fabrication on AlN-Dies

1. Dice AlN ceramic sheets into 1.9 cm×1.0 cm (¾"×¾") square AlN-dies (element 6 in FIG. 2), and clean.
2. Deposit 2000 Angstrom W layer on matte surface of AlN-Dies, by sputtering.
3. Photomask to expose electrode pad and thin film circuit areas (elements 10a, 10b, 8a and 8b in FIG. 2).
4. Deposit 8–10±2 μms of Pt on W, by sputtering.
   Note: Can be performed as a 2 step process (thin Film circuit only required 1.5±0.5 μms of Pt)
5. Deposit 1000 Angstroms of Au on Pt, by evaporation.
6. Lift-off photoresist.
7. Remove excess. (exposed) W with 50:50::DI-water:peroxide etch solution, at room temperature.

Bonding of Chip Electrodes 4a, 4b to Thin Film Circuits 8a, 8b

1. Position chip 2 such that its electrodes 4a, 4b are on thin film circuits 8a, 8b.
2. Place chip/AlN-die 6 pair between two graphite cylinders.
3. Load assembly into RF heated furnace, such than the pair is compressed together.
4. Heat assembly, in Ar. Ramp to 1000° C. in <2 min., shut off heater T>1000° C.
5. Allow 30 minutes for assembly cooling before removal from furnace.
6. Remove from graphite cylinders.

Lead-Wires

Lead-wires (elements 16 in FIG. 4) were welded to the electrode pads 10a, 10b of some, but not all, of the devices.

Final Fabrication

1. The devices were placed on an $Al_2O_3$ ceramic sheet, circuit side up.
2. Lead-wires (when not previously welded on) were positioned over the electrode pads.
3. The circuit side of the devices and the lead wires were coated with an unreacted 60 wt % $B_2O_3$–40 wt % $SiO_2$ mixture in dry powder form.
4. A covering AlN die was placed on top of the unreacted borosilicate mixture.
5. The assembly was inserted into an air environment, tube furnace, preheated to 600° C.–1100° C.
6. One minute after insertion, the assembly was removed, in the form shown in FIG. 6.

Performance results were obtained from five structures in a 3-zone horizontal tube furnace, and from one structure in a "box" furnace. In the tube furnace, the structures were electrically connected to terminals outside the furnace by 8 inch long, 10 mil. diameter Pt wires. A 4-wire configuration was used to ensure that voltage measurements represented the resistance of the SiC resistor. One lead wire from each electrode pad was connected to a constant current source, and the other lead wire to a high impedance voltage meter. A constant current was passed through the SiC resistors at all times, and the voltage drop across the resistors recorded as a function of furnace temperature. The resistance for each voltage reading was calculated by dividing the resistor output voltage by its input current.

The tube furnace temperature was measured with Type-N thermocouples, which were positioned next to the device in the furnace. The thermocouples were sheathed and to maximize their temperature range and minimize their drift, and they had a response time (to 99% of temperature change) of 17 minutes.

Measurement accuracy in the tube furnace was limited to ±100° C. by limitations in furnace stability, thermocouple response time and drift. Temperatures were read dynamically below 800° C. because the furnace could not be stabilized in this temperature range. Above 800° C. the furnace stabilized to within ±50° C. in about one hour. Most data was taken dynamically or when the oscillating thermocouple reading was at a maximum or a minimum at a given furnace temperature setting. Temperatures above 1200° C. are at the extreme high end of the thermocouple range, and an indeterminate amount of drift in the thermocouple voltage output (as a function of temperature) is expected to have occurred.

If the TCRs had been exponential, or exponential-like, then maximum/minimum output voltage changes at least several times greater than those recorded would have been observed. The test controls were not sufficient to provide data that could be used to define a TCR curve; however, the observations were sufficient to identify the TCR envelope, which fits on a linear-linear plot over a temperature range>1,000° C.

Five devices of the type shown in FIG. 6 were fabricated with SiC resistor elements, doped n-type with nitrogen by the SiC wafer-manufacturer. The doping concentrations reported by the SiC wafer manufacturer were 3, 8.5, 3, 2 and $1 \times 10^{18}$ $cm^{-3}$, respectively, for samples 1–5. The resistance obtained from the five different SiC resistors, as a function of temperature, is plotted in FIGS. 9–17. The output voltage versus temperature of the SiC resistors was found to form a generally linear curve which increases with increasing temperature above the starting temperature, which ranged from 100° C. to 600° C.

In the box furnace, reliable measurements were performed only on sample 4, with a doping concentration of $2 \times 10^{18}$ cm$^{-3}$. Using a 2-wire configuration, the lead wire from each electrode pad was connected to a HP34401A MicroOhm/Nano VoltMeter; the total resistance of the SiC resistor, the input/out-put circuit and a clamping RC circuit introduced to reduce noise was read directly from the multimeter. The furnace temperature was measured with a Type-R thermocouple which had a response time of one minute and was positioned with its junction next to the sample in the furnace. Data from these measurements is plotted in FIG. 16.

Figure 16:
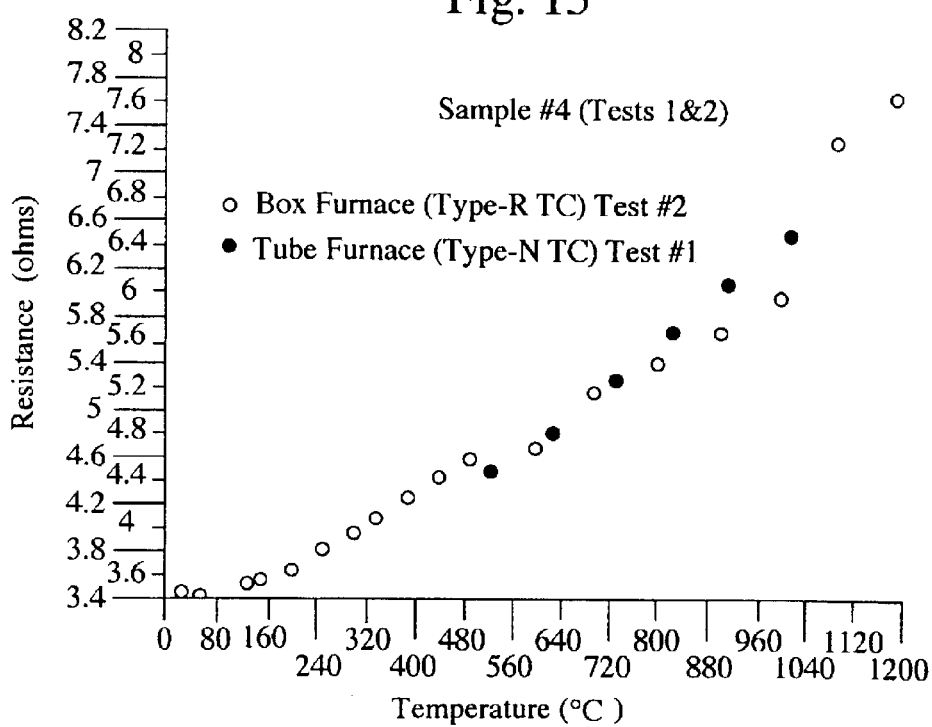
Figure 17:
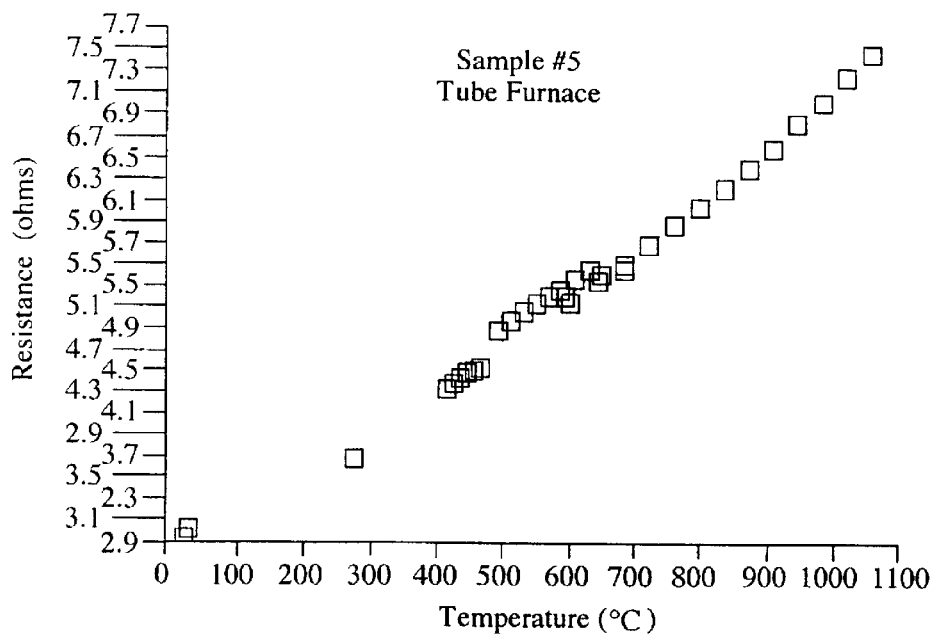

A knee (reversal from positive temperature coefficient of resistance (PTCR) to negative temperature coefficient of resistant (NTCR) occurs between 0° C. and 120° C., in FIG. 16. The explanation is believed to be as follows: Although the samples are doped n-type, they contain p-type impurities (predominantly aluminum). The resistance of the semiconductor should increase steadily, with increasing temperature (PTCR) if: (a) the only mechanism for adding/subtracting conduction electrons and holes is the dependence of the intrinsic concentration on temperature, and (b) the only mechanism for reducing conductivity is the dependence of electron/hole mean free path length on crystal lattice temperature (a higher lattice temperature results in a shorter mean free path length.

The 'knee' occurs in the temperature range where electrons/holes from dopant atoms begin to 'freeze out'. In this case the energy required by a dopant atom to release its electron/hole for participation in the conduction process is greater than, or approximately equal to, the energy provided by the surrounding temperature. As the temperature decreases into this range, the dominant factors influencing conductivity are: (a) the numer of electrons/holes available for conduction (dopant atom concentrations are many orders of magnitude greater than the intrinsic electron/hole concentration in this temperature range), and (b) electron/hole means free path length.

As the temperature decreases the mean free path length increases. Thus, if this were the only active mechanism, resistance should decrease with decreasing temperature. The resistance decrease with decreasing temperature flattens out, and then increases, as less and less dopant atoms receive enough energy to become ionized (release their electrons/holes to participate in conduction). This process is an exponential function of temperature, so that the TRC eventually becomes negative (increases with decreasing temperature).

The activation energy of the p-type dopant (~0.4 eV) (predominantly Al as a background contaminant at about $5 \times 10^{15}$ cm$^{-3}$) is much greater than the activation energy of the predominantly nitrogen n-type dopant (~0.1 eV). Further, the activation energy for a dopant atom becomes spread out over an energy range, as its concentration within a host crystal is increased.

Thus, there are two 'freeze-out' ranges, where resistance should increase exponentially with decreasing temperature. The exact temperature at which (or temperature range over which) reversal from exponential NTCR to approximately linear PTCR occurs is a composite of donor (n-type dopant) and acceptor (p-type dopant) freeze-out rates vs temperature.

These tests established, quite unexpectedly, that the resistance of n-type SiC does not increase exponentially with increasing temperature, as previously reported. Rather, a generally linear TCR was discovered for heavily nitrogen doped n-type SiC within the temperature range of about 22° C. to 1300° C. With p-type doping, the negative TCR at lower temperatures is followed by a positive and approximately linear TCR beginning at a temperature in the range of about 100° C.–600° C., depending upon the doping concentration, with the linear range extending to at least about 1300° C.

Figure 18:
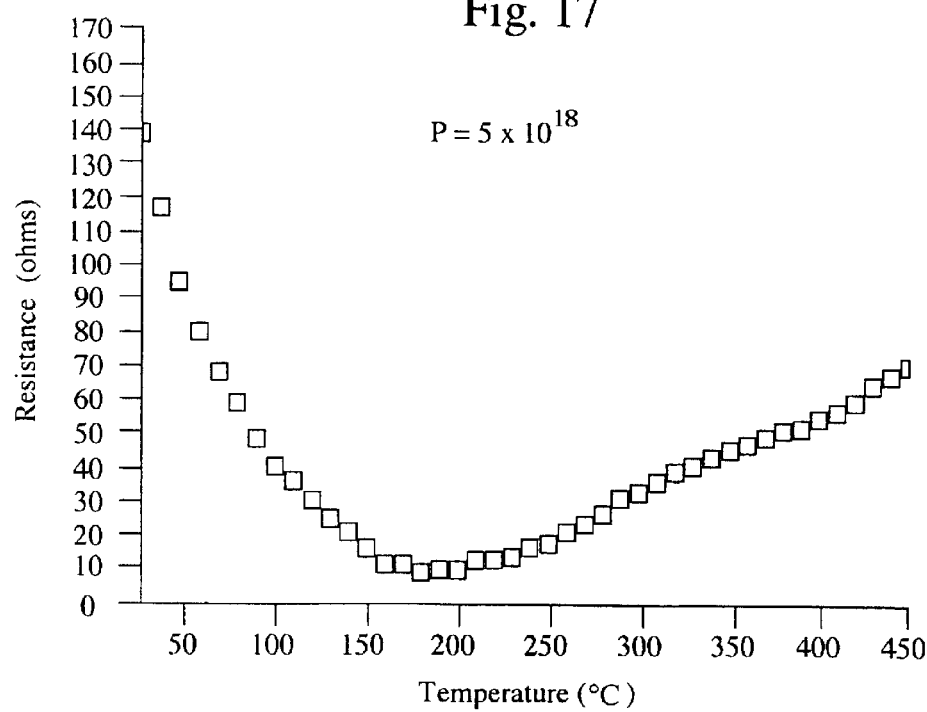
FIGS. 18 and 19 are graphs demonstrating the exponentially decreasing resistance vs temperature characteristic and the transition from exponential negative TC to approximately linear positive TC for different SiC doping concentrations.
Figure 19:
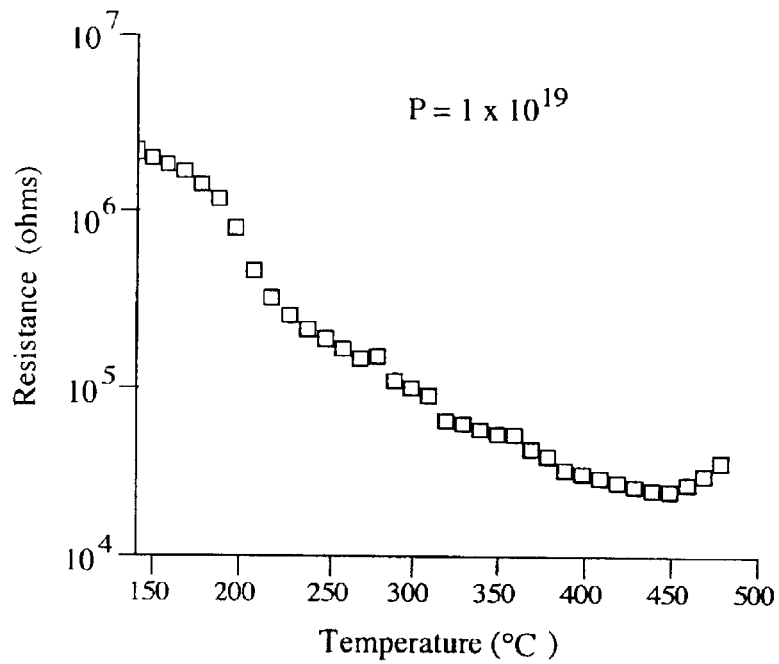

Examples of an exponential NTCR, followed by an approximately linear PTCR, are given in FIGS. 18 and 19. They are based upon data obtained using a hot plate; the manufacturer's specified doping type and concentrations were: FIG. 18 (Al, p-type, $5 \times 10^{18}$ cm$^{-3}$, compensating n-type concentration unknown); and FIG.19 (Al, p-type, $\times 10^{19}$ cm$^{-3}$compensating n-type concentration unknow). Any group III element in the periodic table could be used as the p-type dopant, although Al is preferred because it has the smallest activation energy.

It is anticipated that the "knee" temperature will increase with a decreasing difference between n- and p-type concentrations within a given sample. For example, one could have two n-type samples, one with an n- minus p-type dopant concentration of $5 \times 10^{18}$ cm$^{-3}$ (n=$1 \times 10^{18}$ cm$^{-3}$ and p=$5 \times 10^{17}$ cm$^{-3}$) and the other with an n- minus p-type dopant concentration of $5 \times 10^{18}$ cm$^{-3}$ (n=$1 \times 10^{19}$ cm$^{-3}$ and p=$5 \times 10^{18}$ cm$^{-3}$). It is expected that the second sample would exhibit its "knee" at a higher temperature than the first sample.

The mounting structures provided by this invention can be used to deploy SiC devices as stable temperature sensors beyond the temperature ranges and conditions for which SiC itself is theoretically predicted to function as a semiconductor device. The encapsulated structure of FIG. 6 has been demonstrated to be impervious to thermal shock in the range of about 22° C.–1300° C. The unencapsulated structure of FIG. 4 has been shown to remain stable in air at temperatures greater than 1150° C. for at least 8 hours, and at 1300° C. for at least 3 hours. Above 1150° C. in air, the mechanical properties of the AlN die are expected to change slowly from extremely hard to brittle, but the time required for the change is extremely long. RBM encapsulation should eliminate degradation of the, die's mechanical properties in air up to 1300° C.

Novel attributes of the invention may be summarized as follows:

- operable in an inert environment (Ar, N$_2$) up to about 1,400° C., limited by the stability of metallurgical junctions).
- maximum temperature in an oxidizing atmosphere of about 1350° C.
- maximum sustained operational temperature in a reducing atmosphere (H$_2$) of about 1100° C.
- exceptional thermal shock resistance.
- temperature range due to mechanical limitations of less than –195° C. to 1,400° C.
- temperature range of SiC, AlN and Al$_x$Ga$_{1-x}$N(x>0.69) resistor chips of less than 0° C. to greater than 1300° C.
- temperature range of W, WC and W$_2$C resistor films of less than 195° C. to 1,400° C. These materials are resistors in the sense that their resistance is a function of temperature and strain. Since their thermal expansion coefficient closely matches that of AlN, their change in resistance (or conductivity) vs temperature can be used to measure temperature.
- temperature range for electronic function and semiconductor devices other than resistors:
  SiC:<0° C.–1160° C.
  AlN:<0° C.–1110° C.
  AlGa$_{1-x}$N(x>0.69):<0° C.–930° C.
- response temperature changes much less than 0.1 seconds in still air.

Applications for the invention include temperature sensors, pressure sensors, chemical sensors, and high temperature electronic circuits. Temperature sensors will be addressed first. The response of this type of device is used to measure temperature, electromagnetic radiation energy or power, flow rates, tank liquid levels, humidity, and chemical reactions. Temperature sensors are used in electronics for circuit linearization, compensation of resistance dependence on temperature, voltage regulation, and switching.

When used for temperature sensing, the resistance of the device chip, which provides an indication of temperature, is monitored by measuring either its voltage drop under a constant current bias, or its output current under a constant voltage bias. The chip temperature can be influenced by radiation absorbed from its surroundings, by immersion in gas and/or liquids, and by contact with a solid surface. Radiation absorption and conversion to heat can occur in any or all of the hybrid-circuit components; radiation absorbed by any component other than the device chip must be transferred to the chip by thermal conduction. As an immersion/contact sensor, heat must be conducted from the surface of the hybrid-circuit to the chip by thermal conduction. Thus, the hybrid-circuit components between the chip and the environment should have a high thermal conductivity and/or be very thin.

Temperature measurement devices include: (1) integrated circuits such as transistors, bolometers and pyroelectrics; (2) pyrometers, which are sensitive to infrared, optical and acoustic wavelengths and typically convert the input wavelength to an optical or electronic output by means of an IC, resistance temperature detector or thermocouple; (3) resistance temperature detectors, which include metals in the form of wire, thin or thick films on $Al_2O_3$ and foil, in which the change in metal resistance as a function of temperature produces a change in voltage drop under a constant current bias; (4) thermistors, which include hot-pressed and/or fired ceramics (usually oxides), with embedded wires for electrical contact. Their principle of operation is the same as resistance temperature detectors; (5) thermocouples, which include metals in the form of wires or thin films, with the junction between two dissimilar metals generating a temperature dependent voltage. Although thermocouples do not require an electrical input such as current to the junction itself, they do require an electrical input to maintain a reference junction; (6) electromechanical and volume devices such as metal coils and strips, volumetric tube thermometers and bulb thermometers, in which expansion and contraction of the metal or fluid is used to measure temperature.

Using the invention as a temperature sensor to measure electromagnetic radiation, the radiation input energy is measured after it has been converted to thermal energy. The conversion of the radiation energy to heat energy is accomplished in materials, usually thin or thick films, which are heated by absorbing the radiation. The heat is transferred to the temperature detector by thermal conduction. Radiation detectors of this type are used to sense, calibrate and control the output of: (1) lasers used in industrial and medical applications; (2) ultraviolet (UV) sources used for exposure measurements in applications such as semiconductor process lithography; and (3) infrared (IR) lamps used in furnace heating. The same principles are used by pyrometers to read input radiation as temperature. The contact temperature sensors most commonly used in laser and UV energy, power and exposure detectors are pyroelectrics and thermopiles; ICs, resistance temperature detectors and thermistors are most commonly used in pyrometers.

The invention can be applied to precision flow rate monitoring and control of gases by using it for temperature sensors (usually resistance temperature detectors) in mass flow controllers. In these devices, part of the total gas flow is fed around the main flow path, and the diverted gas is heated as it passes through this alternate path. Each gas has a known and unique heat capacity at constant pressure. Thus, the difference in measured temperatures between multiple temperature sensors positioned in series along the alternate flow path can be used to measure and control the gas flow rate through the device. Applications include processes such as semiconductor IC chip manufacturing which require a precise flow rate control.

Temperature sensors such as resistant temperature detectors, thermistors and thermocouples are also employed as gas and liquid flow sensors by exposure to the primary gas and liquid flow. In this case the sensor can be heated by a constant current source, and the flow rate measured by the change in sensor resistance (the voltage output), with the rate at which heat is removed from the sensor proportional to the fluid flow rate. Applications include oil, gas and chemical pipelines, oil refining, altimeters and volocitometers.

When used to measure tank fluid levels, the principle of operation for temperature sensors implemented with the present invention is similar to that described in connection with flow rate sensors. In this case the heat capacity of the surrounding environment depends upon the surroundings of the gas or liquid sensor, and the density of the medium. A temperature sensor implemented with the invention is located at a known level in a tank, and indicates whether the tank is filled below or above the sensor location. Thermistors are most commonly used for this application, which includes many small tanks such as those used to house fuel, coolant, brake fluid, hydraulic fluid or transmission fluid.

The principle of operation when the invention is applied to a humidity sensor is the same as for flow rate and tank fluid level sensing. In the case of humidity sensors, the atmospheric water content influences the ability of the atmosphere to remove heat from a self-heated sensor, typically a resistance temperature detector or a thermistor.

For chemical reaction detection, contact or immersible temperature sensors determine the temperature at which chemical reactions occur, with the reactions causing the temperature of the medium to rise or fall. The sensor must not participate in the reaction or be damaged by it (at least until the measurement has been completed). Applications for the invention in this area include manufacturing and research and development of chemicals, pharmaceuticals, cosmetics, plastic and rubber polymers, metals and alloys.

In the electronics area, the invention's resistance dependence on temperature can be used for many applications, including resettable fuses, voltage regulation, bridge circuits and switching. As a resettable fuse, positive temperature coefficient thermistors are used to protect electronics from sudden current surges. A temperature rise caused by a surge of current through the thermistor causes its resistance to increase exponentially by order of magnitude over a small temperature range, effectively shutting off power to the electronics. For voltage regulation, negative temperature coefficient thermistors are used to limit and control the voltage drop across power supply electronics and to protect the electronics during battery charging. Increases in temperature due to increased current versus voltage causes the thermistor's resistance to drop exponentially by order(s) of magnitude over a small temperature range, effectively shunting out all parallel circuits. Another important application is delaying and smoothing out the input power to a circuit for input or turn-on surge protection, in which a negative temperature coefficient thermistor initially functions as a leaky open circuit and is then warmed by the current. This cause its resistance to reduce exponentially until it becomes small compared to that of the circuit.

When the invention is used in a bridge circuit, positive and negative temperature coefficient thermistors are arranged in a manner that permits their combined resistance vs temperature characteristics to maintain a constant circuit resistance over a given temperature range. This is very important for constant current sources and constant voltage power supplies. Switch applications for the invention include those now performed by silicon ICs, resistance temperature detectors, thermistors, thermocouples and electromechanical and volume devices which turn electronics on or off as a function of a parameter, such as temperature in heating, ventilation and air conditioning systems.

Figure 20:
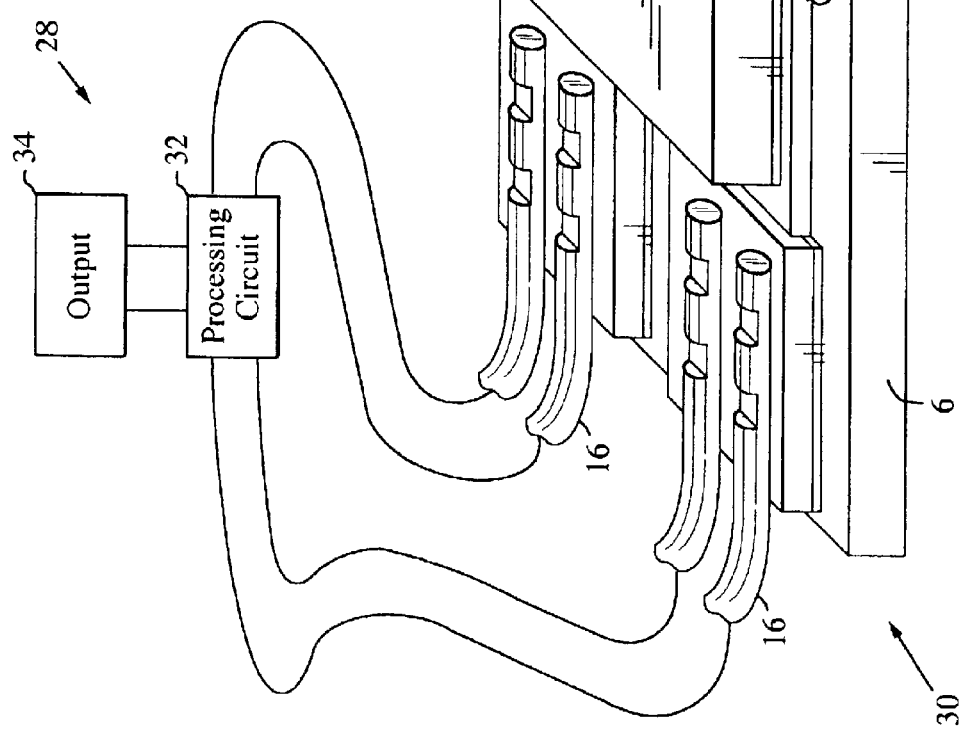
FIG. 20 is a partially block and partially perspective diagram of a generic operating system employing the invention.

FIG. 20 illustrates the structure of the invention used in connection with an operating system 28, examples of which are a temperature sensor employed for temperature measurements, electromagnetic radiation detection, flow rate, tank fluid level, humidity or chemical reaction sensing, or electronics applications, as discussed above, and pressure sensors, chemical sensors and high temperature electronic circuits, as discussed below. The new structure 30 provides an electrical input to a processing circuit 32, which processes the input information to provide an output 34 that either indicates a parameter being sensed, such as temperature, electromagnetic radiation, presence or absence of a particular chemical, etc., or actuates a desired response such as opening or closing a switch 2 sounding an alarm.

Figure 21:
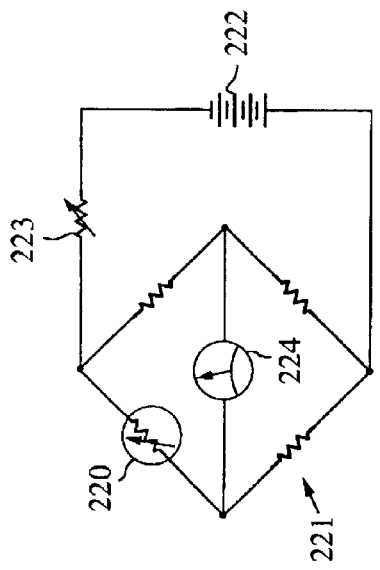
FIG. 21 is a schematic diagram of a temperature sensor application for the invention.

FIG. 21 is a schematic diagram of a basic temperature sensor application for the invention. The circuit is suitable for use when the circuit resistance is much smaller than the sensor resistance. It is application to approximately exponential NTCR and approximately linear PTCR temperature sensors with a resistance at least four times the circuit resistance. A thermistor 220 in accordance with the invention is connected as one leg of a Wheatstone bridge circuit 221, with a battery 222 connected across the bridge and a battery control variable resistor 223 in series with the battery. A current sensor 224, connected across the bridge terminals that are not connected to the battery, provides a readout which varies in accordance with the resistance of thermistor 220, and thus with the ambient temperature.

Numerous variations on this basic circuit are possible, such as providing a switch network that allows thermistors at different locations to be switched into the bridge, connecting two thermistors in the bridge to measure temperature differentials, or inserting a temperature calibrated variable resistor into the bridge as a fifth leg that unbalances the bridge until a desired temperature is established, thus providing a temperature control circuit. If the sensor resistance is comparable to the circuit resistance, as can occur with platinum resistance temperature detectors, circuitry can be added to null out the circuit resistance. All of these general temperature sensor techniques are know in the art.

Figure 22A:
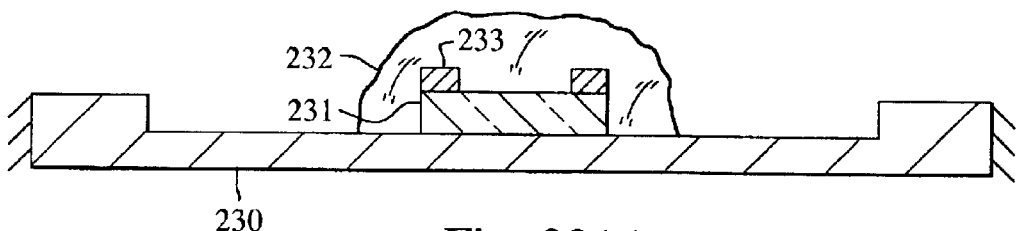
FIGS. 22($a$) and 22($b$) are respectively an illustrative elevation view and a schematic diagram of a pressure sensor application for the invention.
Figure 22B:
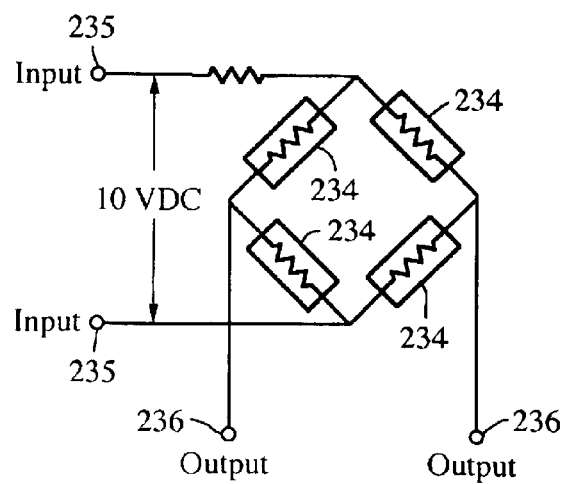

FIGS. 22(a) and 22(b) illustrate a pressure sensor which incorporates the invention. A diaphragm-type pressure sensor for use at high temperatures and in corrosive environments is shown. Applications include aerospace, waste management, power generation and oil well logging.

The physical structure of the pressure sensor is illustrated in FIG. 22(a). A thinned AlN die 230 is secured at its ends, with its opposite faces environmentally isolated by each other. A piezoelectric SiC, AlN or $Al_xGa_{1-x}N(x>0.69)$ chip 231 is held in place directly on the thinned central portion of the die 230 by an RBM encapsulation 232 (shown transparent so that the interior elements can be seen), with lead wires 233 secured to opposite ends of the chip by the RBM. A pressure differential across the die causes its thinned portion to floex, thereby imposing a strain on the chip that alters its resistance. The chip could alternately be held to the die by a conductive mounting layer at its ends, preferably also with an encapsulation RBM, although the lack of a full surface contact with the die could make the chip less responsive to die deflections. A thin film of W, WC and/or $W_2C$ could also be deposited directly on the die in place of the chip.

FIG. 22(b) is a schematic diagram of a conventional pressure sensing circuit in which the structure of FIG. 22(a) can be employed. Four strain gages 234, implemented by four piezoelectric chips 231 at different locations on a common diaphragm, are connected in a full bridge circuit with a DC input applied across input terminals 236. Alternately, two gages could be used, with a pair of fixed resistors completing the bridge.

When employed as a chemical sensor, the response of the invention's temperature sensing element to certain chemicals can be used to monitor their concentration in the environment. One of many possible examples is a SiC MOSFET, deployed as part of one of the structures described herein, in which the work function of the MOS gate is modulated by a particular chemical constituent with which it interacts by reaction or diffusion. Another example is a lateral MESFET without a gate electrode, which is used as a current limiter; the work function of the surface, and thus the channel conductance, is modulated by condensation or reaction with a particular chemical constituent in the surrounding environment.

Figure 23:
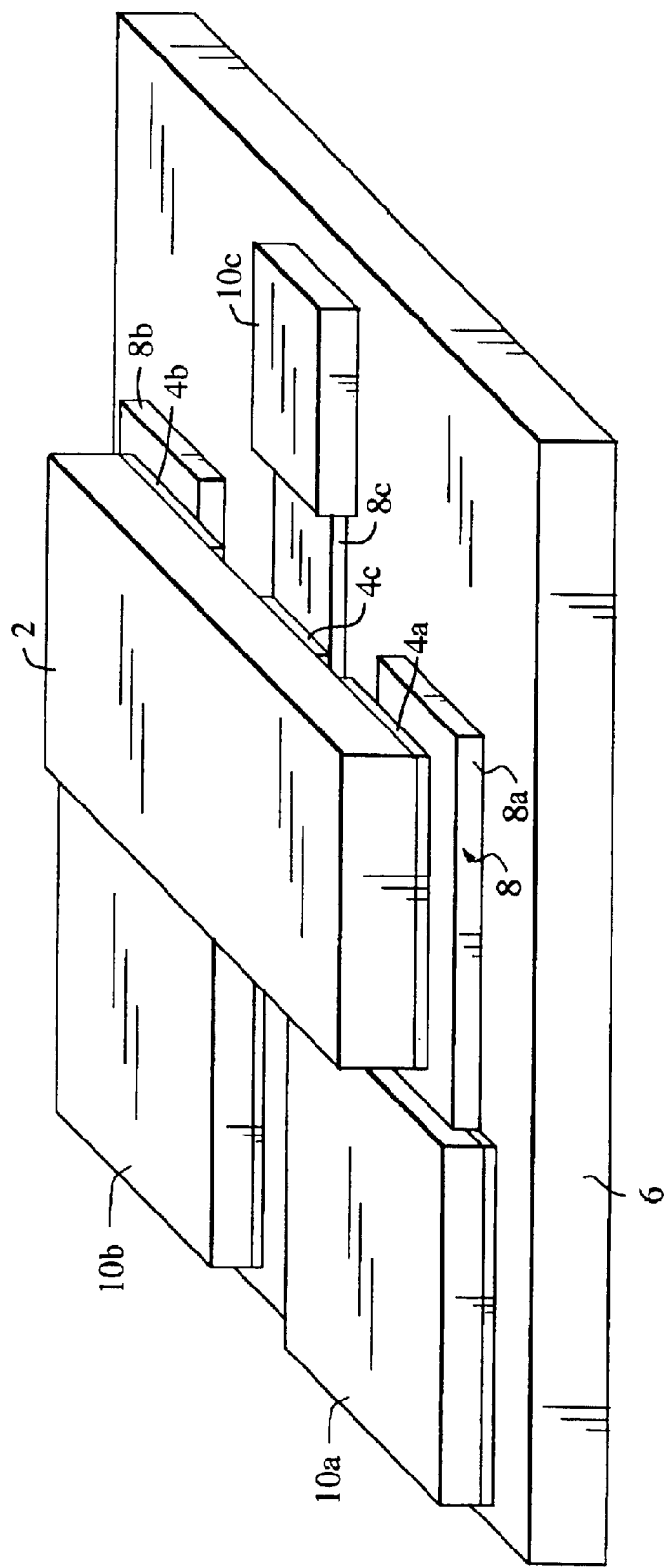
FIG. 23 is a perspective view of a MESFET implemented with the invention.

A basic MESFET is illustrated in FIG. 23. It utilizes the resistor structure described above in connection with FIG. 2, with the mounting elements 8a and 8b serving as connections for the source and drain. An intermediate gate mounting element 8c, of the same type as elements 8a and 8b, makes contact with a gate electrode 4c of the same type as, and located between, the source and drain electrodes 4a and 4b. A gate electrode pad 10c is brought out from gate mounting element 8c on the side of the chip 2 opposite to the source and drain electrode pads 10a and 10b to ensure that the gate, source and drain electrode pads are all isolated from each other.

The basic constituents of a MESFET or MOSFET amplification circuit are a MESFET or MOSFET, and a resistor. The FETs and resistors are preferably flip-chip mounted onto circuitry, located on the die, such that the sources and drains of the FETs and resistors can be biased and form complete current loops with the external electronics. The FET gates are connected such that they can be independently biased.

High temperature electronic circuit applications for the invention, up to 500° C., include sensor and control applications in engines, brakes, hydraulics, spacecraft, high performance aircraft and drones. The structures described in this disclosure, including a single device chip, a grouping of device chips and/or ICs, can be interconnected to each other and/or to the outside world for this purpose.

While several illustrative embodiments of the invention have been shown and described, numerous variations and alternate embodiments will occur to those skilled in the art.

Such variations and alternate embodiments are contemplated, and can be made without departing from the spirit and scope of the invention as defined in the appended claims.

I claim:

1. A circuit structure, comprising:

an AlN substrate, a W, WC and/or $W_2C$ layer on said substrate, and a circuit connected to transmit an electric current through said layer.

2. The circuit structure of claim 1, wherein said substrate is flexible and imposes a strain on said layer when it is flexed to alter the resistance of said layer.

3. A circuit structure, comprising:

an AlN substrate, and a W, WC and/or $W_2C$ layer on said substrate, wherein said substrate is flexible and imposes a strain on said layer when it is flexed to alter the resistance of said layer.

4. A circuit structure, comprising:

an AlN substrate, a piezoelectric layer comprising SiC, AlN and/or $Al_xGa_{1-x}N(x>0.69)$ secured to said substrate, and a circuit connected to transmit an electric current through said layer.

5. The circuit structure of claim 4, wherein said substrate is flexible and imposes a strain on said piezoelectric layer when it is flexed.

6. The circuit structure of claim 5, further comprising circuitry connected to said piezoelectric layer to establish a pressure sensor that senses pressure differentials across said substrate.

7. The circuit structure of claim 4, further comprising an encapsulation formed from a borosilicate mixture securing said piezoelectric layer to said substrate.

8. A circuit structure, comprising:

an AlN substrate, and a piezoelectric layer comprising SiC, AlN and/or $Al_xGa_{1-x}N(x>0.69)$ secured to said substrate, wherein said substrate is flexible and imposes a strain on said piezoelectric layer when it is flexed.

9. The circuit structure of claim 8, further comprising circuitry connected to said piezoelectric layer to establish a pressure sensor that senses pressure differentials across said substrate.

10. A circuit structure, comprising:

an AlN substrate, a piezoelectric layer comprising SiC, AlN and/or $Al_xGa_{1-x}N(x>0.69)$ secured to said substrate, and an encapsulation formed from a borosilicate mixture securing said piezoelectric layer to said substrate.

11. A circuit structure, comprising:

an AlN substrate, and a thin film W, WC and/or $W_2C$ layer on said substrate, wherein said substrate is flexible and imposes a strain on said layer when it is flexed to alter the resistance of said layer.

12. A circuit structure, comprising;

an AlN substrate, and a thin film piezoelectric layer comprising SiC, AlN and/or $Al_xGa_{1-x}N(x>0.69)$ secured to said substrate, wherein said die is flexible and imposes a strain on said piezoelectric layer when it is flexed.

13. The circuit structure of claim 12, further comprising circuitry connected to said piezoelectric layer to establish a pressure sensor that senses pressure differentials across said substrate.

14. A circuit structure, comprising:

an AlN substrate, a thin film piezoelectric layer comprising SiC, AlN and/or $Al_xGa_{1-x}N(x>0.69)$ secured to said substrate, and an encapsulation formed from a borosilicate mixture securing said piezoelectric layer to said substrate.

15. A circuit structure, comprising;

an insulating AlN substrate, and a W, WC and/or $W_2C$ layer on said substrate, wherein said substrate is flexible and imposes a strain on said layer when it is flexed to alter the resistance of said layer.

16. A circuit structure, comprising:

an insulating AlN substrate, and a piezoelectric layer comprising SiC, AlN and/or $Al_xGa_{1-x}N(x>0.69)$ secured to said substrate, with substantially the full surface area of the piezoelectric layer facing the substrate being in direct contact with the substrate.

17. A circuit structure, comprising:

an insulating AlN substrate, and a piezoelectric layer comprising SiC, AlN and/or $Al_xGa_{1-x}N(x>0.69)$ secured to said substrate, wherein said substrate is flexible and imposes a strain on said layer when it is flexed.

18. The circuit structure of claim 17, further comprising circuitry connected to said piezoelectric layer to establish a pressure sensor that senses pressure differentials across said substrate.

19. A circuit structure, comprising:

an insulating AlN substrate, a piezoelectric layer comprising SiC, AlN and/or $Al_xGa_{1-x}N(x>0.69)$ secured to said substrate, and an encapsulation formed from a borosilicate mixture securing said piezoelectric layer to said substrate.

* * * * *